(12) United States Patent
Ellson et al.

(10) Patent No.: US 10,899,072 B2
(45) Date of Patent: Jan. 26, 2021

(54) THIOURETHANE POLYMERS, METHOD OF SYNTHESIS THEREOF AND USE IN ADDITIVE MANUFACTURING TECHNOLOGIES

(71) Applicants: Board of Regents, The University of Texas System, Austin, TX (US); Adaptive 3D Technologies, Dallas, TX (US)

(72) Inventors: Gregory T. Ellson, Dallas, TX (US); Benjamin R. Lund, Wylie, TX (US); Walter Voit, Dallas, TX (US)

(73) Assignees: Adaptive 3D Technologies, Dallas, TX (US); Board of Resents, The University of Texas System, Austin, TX (US)

( * ) Notice: Subject to any disclaimer, the term of this patent is extended or adjusted under 35 U.S.C. 154(b) by 410 days.

(21) Appl. No.: 15/458,220

(22) Filed: Mar. 14, 2017

(65) Prior Publication Data
US 2017/0267804 A1   Sep. 21, 2017

Related U.S. Application Data

(60) Provisional application No. 62/308,664, filed on Mar. 15, 2016.

(51) Int. Cl.
*B29C 64/124* (2017.01)
*C08G 18/18* (2006.01)
(Continued)

(52) U.S. Cl.
CPC ............ *B29C 64/124* (2017.08); *B33Y 10/00* (2014.12); *C08G 18/1841* (2013.01);
(Continued)

(58) Field of Classification Search
None
See application file for complete search history.

(56) References Cited

U.S. PATENT DOCUMENTS 6,448,363 B1   9/2002   Wenning et al.
6,472,451 B2   10/2002  Ha et al.
(Continued)

FOREIGN PATENT DOCUMENTS

CN   1432031 A     7/2003
CN   104487221 A   4/2015
(Continued)

OTHER PUBLICATIONS

Kroger, et al.; "Characterization of the Viscoelastic and Mechanical Properties of Tightly Cross-Linked Polythiourethane Networks"; Wiley InterScience; Journal of Applied Polymer Science; Sep. 20, 2007; pp. 455-462.
(Continued)

*Primary Examiner* — Benjamin A Schiffman
(74) *Attorney, Agent, or Firm* — Finnegan, Henderson, Farabow, Garrett & Dunner, LLP

(57) ABSTRACT

A semi-crystalline thiourethane polymer. The semi-crystalline thiourethane polymer comprises a sequential chain of a first type of monomer covalently bonded to a second type of monomer via thiourethane linkages. Each of the first type of monomer includes two or more thiol functional groups and each of the second type of monomer includes two or more isocyanate functional groups. The first and second types of monomers are polymerized together in an anionic step-growth polymerization reaction that is catalyzed by a non-nucleophillic base having a pKa greater than 7, produced by photo-initiated decomposition of a photolatent base. A
(Continued)

method of synthesizing, and polymer jetting and stereolithography methods of manufacturing a polymer part, are also disclosed.

20 Claims, 13 Drawing Sheets

(51) Int. Cl.
<table>
<tr><td>C08G 18/79</td><td>(2006.01)</td></tr>
<tr><td>B33Y 10/00</td><td>(2015.01)</td></tr>
<tr><td>C08G 18/38</td><td>(2006.01)</td></tr>
<tr><td>C08G 18/73</td><td>(2006.01)</td></tr>
<tr><td>C08G 18/74</td><td>(2006.01)</td></tr>
<tr><td>C08G 18/75</td><td>(2006.01)</td></tr>
<tr><td>C08G 18/76</td><td>(2006.01)</td></tr>
<tr><td>B33Y 70/00</td><td>(2020.01)</td></tr>
<tr><td>B33Y 80/00</td><td>(2015.01)</td></tr>
<tr><td>B29K 75/00</td><td>(2006.01)</td></tr>
<tr><td>B29K 105/00</td><td>(2006.01)</td></tr>
</table>

(52) U.S. Cl.
CPC ..... *C08G 18/1858* (2013.01); *C08G 18/3876* (2013.01); *C08G 18/73* (2013.01); *C08G 18/74* (2013.01); *C08G 18/755* (2013.01); *C08G 18/7621* (2013.01); *C08G 18/7642* (2013.01); *C08G 18/792* (2013.01); *B29K 2075/00* (2013.01); *B29K 2105/0002* (2013.01); *B33Y 70/00* (2014.12); *B33Y 80/00* (2014.12); *C08G 2250/00* (2013.01)

(56) References Cited

U.S. PATENT DOCUMENTS

<table>
<tr><td>6,506,814 B2</td><td>1/2003</td><td>Krongauz et al.</td></tr>
<tr><td>6,586,494 B2</td><td>7/2003</td><td>Mejiritski et al.</td></tr>
<tr><td>7,893,127 B2</td><td>2/2011</td><td>Nagvekar et al.</td></tr>
<tr><td>8,329,717 B2</td><td>12/2012</td><td>Shiraishi et al.</td></tr>
<tr><td>8,883,392 B2</td><td>11/2014</td><td>Napadensky et al.</td></tr>
<tr><td>8,921,446 B2</td><td>12/2014</td><td>Nakatani et al.</td></tr>
<tr><td>9,303,123 B2</td><td>4/2016</td><td>Kurata et al.</td></tr>
<tr><td>9,534,151 B2</td><td>1/2017</td><td>Fujimoto et al.</td></tr>
<tr><td>9,559,073 B2</td><td>1/2017</td><td>Tamura et al.</td></tr>
<tr><td>2003/0212164 A1</td><td>11/2003</td><td>Klinkenberg et al.</td></tr>
<tr><td>2008/0269050 A1</td><td>10/2008</td><td>Azizian et al.</td></tr>
<tr><td>2009/0169872 A1</td><td>7/2009</td><td>Krongauz et al.</td></tr>
<tr><td>2011/0028585 A1</td><td>2/2011</td><td>Shiraishi et al.</td></tr>
<tr><td>2011/0144227 A1</td><td>6/2011</td><td>Bowman et al.</td></tr>
<tr><td>2011/0195237 A1</td><td>8/2011</td><td>Patel et al.</td></tr>
<tr><td>2011/0201717 A1</td><td>8/2011</td><td>Held et al.</td></tr>
<tr><td>2012/0157564 A1</td><td>6/2012</td><td>Kurata</td></tr>
<tr><td>2014/0323647 A1</td><td>10/2014</td><td>Voit et al.</td></tr>
<tr><td>2015/0056421 A1</td><td>2/2015</td><td>Yudovin-Farber et al.</td></tr>
</table>

FOREIGN PATENT DOCUMENTS

<table>
<tr><td>CN</td><td>105392618 A</td><td>3/2016</td></tr>
<tr><td>JP</td><td>2009-543913 A</td><td>12/2009</td></tr>
<tr><td>JP</td><td>2014005260 A</td><td>1/2014</td></tr>
<tr><td>JP</td><td>5475067 B2</td><td>4/2014</td></tr>
<tr><td>WO</td><td>WO 01/92362 A1</td><td>12/2001</td></tr>
<tr><td>WO</td><td>WO 2008/009575 A2</td><td>1/2008</td></tr>
<tr><td>WO</td><td>WO 2008/014597 A1</td><td>2/2008</td></tr>
<tr><td>WO</td><td>2009122664</td><td>10/2009</td></tr>
<tr><td>WO</td><td>2015014381 A1</td><td>2/2015</td></tr>
<tr><td>WO</td><td>2017140490 A1</td><td>8/2017</td></tr>
</table>

OTHER PUBLICATIONS

Katogi, et al.; "Photobase Generation from Amineimide Derivatives and Their Use for Curing an Expoxide/Thiol System"; R&D Center, Hitachi Chemical Co., Ltd.; Aug. 22, 2002; pp. 4045-4052.

Kultys, et al.; "Transparent poly(thiourethane-urethane)s based on dithiol chain extender"; DOI; Jun. 25, 2014; pp. 1427-1439.

Lapprand, et al.; "Synthesis and Properties of Self-Crosslinkable Thermoplastic Polyurethanes"; Wiley InterScience; Journal of Applied Polymer Science; Jun. 13, 2006; pp. 99-113.

Li, et al.; "Comparison of Small Molecule and Polymeric Urethanes, Thiourethanes, and Dithiourethanes: Hydrogen Bonding and Thermal, Physical, and Mechanical Properties"; Maromolecules, vol. 42; No. 6; Jan. 8, 2009; pp. 1824-1833.

Li, et al.; "Thiourethane-Based Thiol-Ene High Tg Networks: Preparation, Thermal, Mechanical, and Physical Properties"; Wiley InterScience; Journal of Polymer Science; Jun. 6, 2007; pp. 5103-5111.

Lu, et al.; "High refractive index thin films of ZnS/polythiourethane nanocomposites"; Jan. 13, 2003; 5 pgs.

Matsushima, et al.; "Thiol-Isocyanate-Acrylate Ternary Networks by Selective Thiol-Click Chemistry"; Wiley InterScience; Journal of Polymer Science; Apr. 16, 2010; pp. 3255-3264.

McNair, et al.; "Sequential Thiol Click Reactions: Formation of Ternary Thiourethane/Thiol-Ene Networks with Enhanced Thermal and Mechanical Properties"; ACS Applied Materials & Interfaces; 2014; pp. 6088-6097.

Nakayama, et al.; "Synthesis of novel UV-curable difunctional thiourethane methacrylate and studies on organic-inorganic nanocomposite hard coatings for high refractive index plastic lenses"; R&D Center, Mitsui Chemicals, Inc.; Jan. 7, 2008; pp. 274-284.

Novakov, et al.; "Study of the Structure and Curing of Thiourethane Elastomers Based on Oligomer Compositions"; Polymer Science, Series B, vol. 54; Nov. 8, 2011; pp. 240-246.

Rogulska, et al.; New thermoplastic poly(thiourethane-urethane) elastomers based on hexane-1,6-diyl diisocyanae (HDI); The Authors; Feb. 15, 2013; pp. 903-916.

Shin, et al.; "Segmented Polythiourethane Elastomers through Sequential Thiol-Ene and Thiol-Isocyanate Reactions"; Macromolecules, vol. 42, No. 9; Mar. 3, 2009; pp. 3294-3301.

Shin, et al.; "Thiol-Isocyanate-Ene Ternary Networks by Sequential and Simultaneous Thiol Click Reactions"; Chemistry of Materials Article; Feb. 11, 2010; pp. 2616-2625.

Dietliker, et al.; "Advancements in photoinitiators—Opening up new applications for radiation curing"; Process in Organic Coatings; Elsevier; Jun. 2, 2006; 12 pgs.

Hoyle, et al.; "Thiol-chick chemistry: a multifaceted toolbox for small molecule and polymer synthesis"; Chemical Society Reviews; www.rsc.org/csr; The Royal Society of Chemistry 2010; Sep. 4, 2009; 34 pages.

Dogan, et al.; "Fast UV—A curable clearcoat (English)"; TIB Leibniz Information Centre for Science and Technology University Library; 2005; 1 page.

Chinese Office Action for Application No. 201780017559.7, dated Jun. 4, 2020.

Dietliker et al., "Advancements in photoinitiators—Opening up new applications for radiation curing," Progress in Organic Coatings 58: 146-157 (2007).

Fouassier et al., "Dyes as photoinitiators or photosensitizers of polymerization reactions." Materials 3(12): 5130-5142 (2010).

Guo, "Thermosets: Structure, properties, and applications," Chapter 1: Overview of thermosets: structure, properties and processing for advanced applications, Woodhead Publishing Limited (2012).

Hoyle et al., "Thiol-enes: Chemistry of the past with promise for the future," Journal of Polymer Science: Part A: Polymer Chemistry 42(21): 5301-5338 (2004).

International Search Report for PCT/US2017/022268, dated Jun. 6, 2017.

Jin et al., "Kinetics of multifunctional thiol-epoxy click reactions studied by differential scanning calorimetry: effects of catalysis and functionality," Polymer 81: 70-78 (2015).

Koo et al., "Limitations of radical thiol-ene reactions for polymer-polymer conjugation," Journal of Polymer Science Part A: Polymer Chemistry 48(8): 1699-1713 (2010).

(56) References Cited

OTHER PUBLICATIONS

Kumar et al., "Reinforcement of Stereolithographic Resins for Rapid Prototyping With Cellulose Nanocrystals," ACS Appl Mater Interfaces, 4(10): 5399-5407 (2012).

Leonards et al., "Advantages and drawbacks of Thiol-ene based resins for 3D-printing," *Laser 3D Manufacturing II.* vol. 9353. International Society for Optics and Photonics (2015).

Leonards et al., "Stereolithographic Processing and Biocompatibility of a Thiol-ene Based Resin."

Li et al., "The effect of thiol and ene structures on thiol-ene networks: Photopolymerization, physical, mechanical and optical properties," Polymer 50(10): 2237-2245 (2009).

Ligon et al., "Advanced applications of thiol-ene formulations" 2014 UV & EB Technical Conference Proceedings (2014).

Ligon et al., "Strategies to reduce oxygen inhibition in photoinduced polymerization." Chemical Reviews 114(1): 557-589 (2014).

Lowe, "Thiol-ene 'click' reactions and recent applications in polymer and materials synthesis," Polymer Chemistry 1(1): 17-36 (2010).

Murofushi, "The characteristic of the secondary thiol compounds and its application." Corporate R&D Center, Showa Denko K.K., Kawasaki, Japan.

Northrop et al., "Thiol-ene click chemistry: computational and kinetic analysis of the influence of alkene functionality," Journal of the American Chemical Society 134(33): 13804-13817 (2012).

Pascualt et al., "Thermosetting Polymers," Marcel Dekker, Inc. (2002).

Pfeifer et al., "Delayed gelation through chain-transfer reactions: Mechanism for stress reduction in methacrylate networks," 52(15): 3295-3303, (2011).

Pukánszky, "Optical clarity of polypropylene products," Kluwers Publishers (1999).

Sharmin et al., "Polyurethane: an introduction," Polyurethane: 3-16 (2012).

Written Opinion of the International Searching Authority for PCT/US2017/022268, dated Jun. 6, 2017.

Yao et al., "Kinetics based on the base-catalyzed mechanism of a click reaction between glycol dimercaptoacetate and glycidyl phenyl ether," *RSC advances* 7(18): 10881-10884 (2017).

Zarek et al., "3D Printing of Shape Memory for Flexible Electronic Devices," Adv Mater, 28(22): 4449-4454 (2016).

Examination Report for Australian Application No. 2017234286, dated Aug. 20, 2020.

Office Action for Chinese Application No. 201780017559.7, dated Nov. 4, 2020, 7 pages.

Office Action for Japanese Application No. 2019-500226, dated Nov. 11, 2020, 6 pages.

THIOURETHANE POLYMERS, METHOD OF SYNTHESIS THEREOF AND USE IN ADDITIVE MANUFACTURING TECHNOLOGIES

CROSS-REFERENCES TO RELATED APPLICATION

This application claims the benefit under 35 U.S.C. § 119(e) of U.S. Provisional Patent Application No. 62/308,664 filed Mar. 15, 2016, which is incorporated herein by reference in its entirety as if fully set forth herein.

TECHNICAL FIELD

This application is directed, in general, to thiourethane polymers and more specifically semi-crystalline forms of such polymers, methods of synthesis, and, using such polymers and methods in additive manufacturing technology applications.

BACKGROUND

Industrial additive manufacturing technologies using polymers, such as 3-dimensional (3D) polymer printing technologies, can be limited due to the final polymer product having a low toughness, narrow thermal operating range, and/or poor mechanical isotropy. For instance, resins using acrylate monomers for producing polymer parts via stereolithography can react rapidly, ensuring that short printing times but, the end product polyacrylate polymer may be either brittle glassy materials or soft rubber-like materials, neither of which have the desired high toughness. Hybrid resins using acrylates and epoxides cured by both photo-radical and photo-cationic initiators or using urethane or epoxy oligomers and acrylates can produce tougher end-polymers with rapid curing. However, such resins often exhibit a higher viscosity and therefore longer printing time and a higher cost. Moreover, 3D printed parts produced using such resins can have poor mechanical performance due to poor inter-layer adhesion. For instance, the parts can have excellent mechanical properties in-line with the printed layer direction (e.g., X and Y axes), but poor mechanical properties when stressed perpendicular to the printed layers (e.g., Z axis). Furthermore, the amorphous structure of such polymers restricts the performance of 3D parts produced therefrom, as compared to semi-crystalline engineering plastics. Thus, there is a continuing need to develop resins and synthetic processes to yield tough polymers suitable for 3D printing technologies.

SUMMARY

The present disclosure provides in one embodiment, a semi-crystalline thiourethane polymer. The semi-crystalline thiourethane polymer comprises a sequential chain of a first type of monomer covalently bonded to a second type of monomer via thiourethane linkages. Each of the first type of monomer includes two or more thiol functional groups and each of the second type of monomer includes two or more isocyanate functional groups. The first and second types of monomers are polymerized together in an anionic step-growth polymerization reaction that is catalyzed by a non-nucleophillic base having a pKa greater than 7, produced by photo-initiated decomposition of a photolatent base.

Still another embodiment of the disclosure is a method of synthesizing a semi-crystalline thiourethane polymer. The method comprises forming a mixture that includes a first type of monomer, a second type of monomer and a photolatent base. The first type of monomer includes two or more thiol functional groups and the second type of monomer includes two or more isocyanate functional groups. The method further comprises photo-initiating decomposition of the photolatent base to form a non-nucleophillic base catalyst having a pKa greater than 7 to thereby initiate step-growth polymerization of the first type of monomer with the second type of monomers.

Still another embodiment of the disclosure is a polymer jetting method of manufacturing a polymer part. The method comprises exposing a deposited mixture to light to photo-initiate decomposition of a photolatent base in the mixture to form a non-nucleophillic base catalyst having a pKa greater than 7 to thereby initiate step-growth polymerization of a first type of monomer with a second type of monomer in the mixture to thereby form a semi-crystalline thiourethane polymer part, wherein the first type of monomer includes two or more thiol functional groups and the second type of monomer includes two or more isocyanate functional groups.

Still another embodiment of the disclosure is a stereolithography method of manufacturing a polymer part. The method comprises forming a mixture of a first type of monomer, wherein the first type of monomer include two or more thiol functional groups, a second type of monomer, wherein the second type of monomer include two or more isocyanate functional groups, and a photolatent base. The method further comprises exposing portions of the mixture to light to photo-initiate decomposition of the photolatent base to form a non-nucleophillic base catalyst having a pKa greater than 7 to thereby initiate step-growth polymerization of the first type of monomer with the second type of monomers

BRIEF DESCRIPTION OF DRAWINGS

For a more complete understanding of the present disclosure, reference is now made to the following detailed description taken in conjunction with the accompanying FIGUREs, in which.

DETAILED DESCRIPTION

Figure 1:
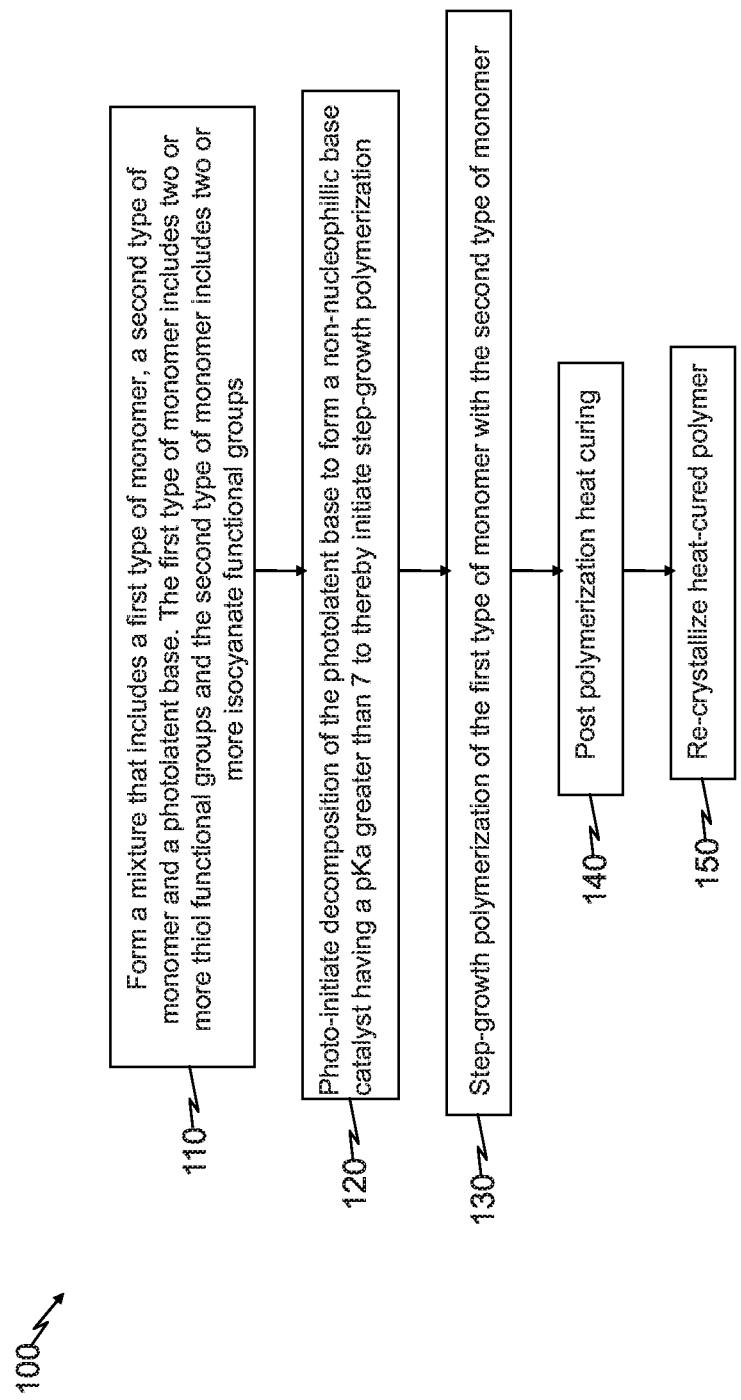
FIG. 1 illustrates by flow diagram, selected aspects of an example method of synthesizing semi-crystalline thiourethane polymers according to the principles of the present disclosure.

Embodiments of the present disclosure benefit from the discovery that semi-crystalline thiourethane polymers can be synthesized via a fast anionic step-growth polymerization mechanism from mixtures containing a first type of monomer having two or more thiol functional groups and a second type of monomer having two or more isocyanate in the presence of a photolatent base that upon photo-initiation decomposes to form a non-nucleophillic base having a pKa greater than 7.

The rapid reaction rate of the thiol-isocyanate coupling afforded by this combination of monomers and non-nucleophillic base catalyst make this thiol-click polymerization chemistry an excellent candidate for providing application specific material such as but not limited to impact-resistant materials, 3D printing resins, bio-implantable material, or protective coatings.

One embodiment of the disclosure is a semi-crystalline thiourethane polymer. The semi-crystalline thiourethane polymer comprises a sequential chain of a first type of monomer covalently bonded to a second type of monomer via thiourethane linkages. Each of the first type of monomer includes two or more thiol functional groups and each of the second type of monomer includes two or more isocyanate functional groups. The first and second types of monomers are polymerized together in an anionic step-growth polymerization reaction that is catalyzed by a non-nucleophillic base having a pKa greater than 7, produced by photo-initiated decomposition of a photolatent base.

In some embodiments, to avoid or reduce other chemical reactions from occurring, it is preferable for the first and second types of monomers to not have any other types of functional groups that may react, either before or during photo-initiation, with the thiol functional and isocyanate functional groups of the first and second types of monomers.

In some embodiments for instance, the first type of monomer does not have -ene or isocyanate functional groups and the second type of monomer does not have -ene or thiol functional groups. In some embodiments for instance, the first type of monomer only has thiol functional groups and the second type of monomer only has isocyanate functional groups.

The photolatent base of the disclosure can be any organic or inorganic molecule, which upon irradiation with light (e.g., UV or visible light), decomposes into one or more basic components which include a non-nucleophillic base having a pKa greater than 7. The presence of such a non-nucleophillic base is thought to advantageously provide a base that will catalyze the thiol-isocyanate polymerization reaction but will not react with the isocyanate functional groups and therefore can favorably provide stable reaction rates. Such non-nucleophillic bases are highly desirable catalysts to use because they will not react with the isocyanate groups of the second type monomer and thereby terminate the desired isocyanate-thiol polymerization reaction. This is in contrast to other types of photolatent bases which can photo-decompose to form a nucleophillic base, such as primary amines or secondary amines, which will react with the isocyanate groups to form a urea, and therefore, are unsuitable for use as catalysts of the isocyanate-thiol polymerization reactions as disclosed herein.

Non-limiting examples of the photolatent base include amineimide photobases, such as DANBA, which decompose upon UV irradiation to provide a tertiary amine photo-decomposition product which serves as the non-nucleophillic base having a pKa greater than 7. Other photolatent bases include BTOTPB, NTOTPB, PTOTPB, BBTTPB or TMTOTPB which decompose upon irradiation to provide a triethylamine photo-decomposition product which serves as the non-nucleophillic base. Still another photolatent base include the presently unnamed compound Chemical Abstracts Service number (CAS) 1857358-47-4.

In some embodiments, the amount of the photolatent base added to the mixture is a value in a range from about 0.005 wt % to 5 wt % relative to the total weight of the first and second types of monomers, and in some embodiments, a value in a range from about 0.1 to 1 wt %. In some embodiments, high amounts of photolatent base e.g., 1 wt % or higher, may create light scattering effects which may be undesirably cause the polymerization reaction to proceed too rapidly and thus, e.g., deter from forming the target shaped polymer in a 3D print application. Additionally, the presence of the non-nucleophillic base in the final polymer product may confer the polymer with more plasticity than desired. In some embodiments low amounts of photolatent base e.g., less than 0.1 wt % may help to mitigate such light scattering or plasticizing effects, but, possibly at the detriment of slower polymerization times. In some embodiments higher amounts of photolatent base may be needed, e.g., depending on the strength of the light source used in 3D printing. In some embodiments, photolatent base is up to about 5 wt %, and in some embodiments up to about 2 wt %, relative to the total weight of the first and second types of monomers in the mixture.

It was discovered that the presence of semi-crystallinity (e.g., crystallite structures among non-crystalline amorphous structure in the polymer) can beneficially impart toughness to the thiourethane polymers. The term toughness as used herein refers to the integrated area of a stress strain curve for a standard dog bone polymer sample as expressed in units of $MJ/m^3$. One skilled in the pertinent art would understand how to determine the percentage of crystallinity present in a polymer from x-ray scattering data or a differential scanning calorimetry measurements collected from the polymer.

As used herein one of the disclosed thiourethane polymers are defined to be tough if their toughness, equals about 10 MJ/m$^3$ or higher, and, are defined to be ultra-tough if the toughness equals about 50 MJ/m$^3$ or higher. In some embodiments, the semi-crystalline thiourethane polymers of the disclosure are tough, and in some embodiments, ultra-tough. In some embodiments, the semi-crystalline thiourethane polymers can have a toughness value in a range from 10 to 100 MJ/m$^3$ and other embodiments a toughness value in a range from 100 to 150 MJ/m$^3$.

It was also discovered that in some embodiments, the degree of crystallinity of these polymers can be adjusted by controlling the degree of crosslinking between growing chains of thiourethane polymers during the polymerization reaction. The degree of crystallinity can be increased by increasing the proportions of monomers of the first type and/or monomers of the second type having di-functional thiol and isocyanate groups, respectively. The presence of such di-functionalized monomers in the mixture is thought to facilitate the growth and elongation of linear non-crosslinked segments of the polymer chain during polymerization. The degree of crystallinity can be decreased by increasing the proportions of monomers of the first type and/or monomers of the second type with tri-functional or higher thiol and isocyanate groups, respectively. The degree of crystallinity can be increased or decreased by using di-functional monomers with backbone structures that will tend to crystallize more or less favorably, respectively. The presence of such tri- or higher functionalized monomers is thought to facilitate the crosslinking between segments of the polymer chain during polymerization which in turn tends to decrease the number or length of linear non-crosslinked segments in the polymer.

It is desirable for some embodiments of the thiourethane polymers to have a crystallinity in a certain range to provide the requisite toughness for a specific application, e.g., for use in 3D printing applications. For instance, in some embodiments, if the proportion of such tri- or higher functionalized monomers is too high, then the resulting thiourethane polymers can have a non-crystalline amphorous structure that is not tough. In other embodiments, if the proportion of such tri- or higher functionalized monomers is too low or zero then the resulting thiourethane polymers can have a fully or near fully crystalline structure, resulting in a very brittle structure that is also not tough. For instance, in some embodiments, it is preferable for the thiourethane polymer to have percentage crystallinity value that is in a range from about 5 percent to about 90 percent, and in some embodiments, from about 20 to 60 percent. In some embodiments, a value in a range from about 20 percent to about 40 percent may confer the polymer with a high or maximal toughness which may be desirable for certain 3D printing applications. In some embodiments, a value in a range from about 40 percent to about 60 percent may confer the polymer with a high dielectric constant which may be desirable for certain electronics application. In some embodiments the percentage crystallinity value of the thiourethane polymer can be in such ranges at room temperature (20° C.) while in some embodiments such ranges of the percentage crystallinity of the polymer can be in such ranges at physiologic temperature (e.g., about 37° C.) which may be desirable for certain biological applications (e.g., implantable probes).

In some embodiments, for example, the mixture of monomers includes a combination of two different compounds of the first type of monomer having two or more thiol functional groups: a di-thiol functionalized monomer and a tri-thiol or higher functionalized monomer. In some embodiments, only one type of di-thiol functionalized monomer compound is used and only one type of tri-thiol or higher functionalized monomer is used in the mixture. In other embodiments, to facilitate further adjustment of the physical properties of the polymer more than one type of di-thiol functionalized monomer compound and/or more than type of tri-thiol or higher functionalized monomer may be used in the mixture.

In some embodiments, it is thought that crystallinity in the polymer can be promoted when the di-thiol functionalized monomer is a straight-chain aliphatic compound having a molecular weight in a range from about 100 to 300 gm/mol. Such monomers may also have advantageous properties for 3D printing application such as low viscosity (e.g., similar to the viscosity of water) and miscibility with other components of the mixture which may allow the mixture to be solvent-free. Non-limiting examples of such di-thiol functionalized monomers include EDT, PDT, HDT or DDT. In some such embodiments, the straight-chain is a carbon-only straight chain.

In some embodiments it is thought that crystallinity can be promoted in the polymer when the two thiol functional groups of the di-thiol functionalized monomer are located at either end of the chain. For example, in some embodiments, the di-thiol functionalized monomer may be an alkane having the chemical formula HS—(CH$_2$)$_n$—SH where n is a number in the range of 2 to 10. Additionally, in some such embodiments, the use of such short chain di-thiol functionalized monomers were discovered to facilitate the synthesis of polythiourethanes having a high melt temperatures (e.g., in some embodiment greater than 100° C. and in other embodiments greater than 150° C.). While not limiting the scope of the disclosure by theoretical considerations, it is thought such shorter chain length di-thiol functionalized monomers, particularly when used with similarly shorter chain length di-isocynate functionalized monomers, promote the formation linear chains in the polymer which in turn tends to increase the amount of crystallinity in the polymer. It is thought that this is most likely due to the increase in the number of thio-isocyanate groups in the backbone, increasing both rigidity and hydrogen bonding between the chains and raising the melt temperature.

In some embodiments, the straight-chain di-thiol functionalized monomer can include one or more oxygen and/or sulphur atoms in the chain as alkyl ether and/or thio-ether groups, respectively. Non-limiting examples include TDET, EDDT or BD1. It is thought that the inclusion of oxygen or sulphur in the polymer backbone due to presence of such alkyl ether and/or thio-ether containing di-thiol functionalized monomers may disrupt orderly packing of the linear segments of the polymer. This in turn may reduce the thermal energy necessary to melt the crystallites and/or discourage recrystallization. As such the inclusion of such ether and/or thioether groups in the chain of the di-thiol functionalized monomers may be used to adjust the melting point and recrystallization of the polythiourethane polymers synthesized as described herein. For instance, the replacement of some or all of the above described straight-chain aliphatic di-thiol functionalized monomers with alkyl ether and/or alkyl sulfide containing analogs may reduce the polymer's melt temperature and/or enhance crystallization hysteresis.

In still other embodiments, the di-thiol functionalized monomer may include branched-chained or cyclic compounds (e.g., TCDDT) and/or aromatic compounds having a molecular weight in a range from about 100 to 300 gm/mol. In other embodiments longer chain length compounds may be used, e.g., a molecular weight in a range from about 300 to 1000 gm/mol. In yet other embodiments one or both of the thiol functional groups are not located at the ends of the straight chain but rather are be located on internal atoms of the chain.

In some embodiments, the tri-thiol or higher functionalized monomer is a tri-thiol functionalized monomer. Non-limiting examples include TMICN or TMTMP. In some embodiments, the tri-thiol or higher functionalized monomer is a tetra-thiol functionalized monomer. A non-limiting example includes PETMP. Still other embodiments may include penta- hexa- or hepta-thiol functionalized monomers. It is thought that crosslinking may be promoted by increasing the number of thiol functions per monomer molecule. In some such embodiments, it can be advantageous, so as to provide a low viscosity and miscibility with other components of the mixture, for the tri-thiol or higher functionalized monomer to have a molecular weight of 300 gm/mol or less, although in other embodiments higher molecular weight monomers may be used.

In some embodiments, for example, the mixture of monomers can include a combination of two different compounds of the second type of monomer having two or more isocyanate-functional groups: a di-isocyanate functionalized monomer and a tri-isocyanate or higher functionalized monomer. In some embodiments, only one type of di-isocyanate functionalized monomer compound is used, and only one type of tri- di-isocyanate or higher functionalized monomer is used, in the mixture. In other embodiments, to facilitate further adjustment of the physical properties of the polymer, more than one type of di-isocyanate functionalized monomer compound and/or more than type of tri-isocyanate or higher functionalized monomer can be used in the mixture.

For some embodiments, it is thought that crystallinity in the polymer can be promoted when the di-isocyanate functionalized monomer is a straight-chain aliphatic compound having a molecular weight in a range from about 100 to 300 gm/mol. Additionally, for the same reasons expressed above, the low viscosity and miscibility properties of such compounds can be advantageous. Similarly, for some embodiments, it is thought that crystallinity can be promoted in the polymer when the two isocyanate functional groups of the di-isocyanate functionalized monomer are located at either end of the chain. In some such embodiments the straight-chain is a carbon-only straight chain. For example, in some embodiments, the di-isocyanate functionalized monomer may be an alkane having the chemical formula OCN—$(CH_2)_n$—NCO where n is a number in the range of 2 to 10. A non-limiting example of such a di-isocyanate functionalized monomer is HDI. For the same reasons expressed above, such shorter chain lengths of di-isocyanate functionalized monomers, particularly when used with similarly shorter chain length di-thiol functionalized monomers, is thought promote the formation linear chains in the polymer which in turn tends to increase the amount of crystallinity in the polymer.

In other embodiments, however, the straight-chain di-isocyanate functionalized monomer can include one or more oxygen and/or sulphur atoms in the chain as alkyl ether and/or thio-ether groups, respectively. In still other embodiments, the di-isocyanate functionalized monomer may include branched-chained or cyclic compounds (e.g., IDI or HDI-T) and/or aromatic compounds (e.g., XDI or TDI) and have a molecular weight in a range from about 100 to 300 gm/mol. In other embodiments longer chain length compounds may be used, e.g., a molecular weight in a range from about 300 to 1000 gm/mol. In yet other embodiments, one or both of the isocyanate functional groups are not located at the ends of the straight chain but rather are be located on internal atoms of the chain.

In some embodiments, the tri-isocyanate or higher functionalized monomer is a tri-isocyanate functionalized monomer or a tetra-isocyanate functionalized monomer. Still other embodiments include penta- hexa- or hepta-isocyanate functionalized monomers. It is thought that crosslinking may be promoted by increasing the number of isocyanate functions per monomer molecule. In some such embodiments it can be advantageous, so as to provide a low viscosity and miscibility with other components of the mixture, for the tri-isocyanate or higher functionalized monomer to have a molecular weight of 300 gm/mol or less, although in other embodiments higher molecular weight monomers may be used.

In some embodiments, when the mixture includes the first type of monomer with both the di-thiol and tri-thiol or higher functionalized monomers, then the mixture may only include the second type of monomer having the di-isocyanate functionalized monomer. Conversely, in some embodiments, when the mixture includes the second type of monomer with both the di-isocyanate and tri-isocyanate or higher functionalized monomers then the mixture may only include the first type of monomer having the di-thiol functionalized monomer. However, in still other embodiments, the mixture could include combinations of di-thiol functionalized monomers, tri-thiol or higher functionalized monomers, di-isocyanate functionalized monomers and tri-isocyanate or higher functionalized monomers.

Non-limiting examples of the first type of monomer include: Trimethylolpropane tris(3-mercaptopropionate); Trimethylolpropane tris(2-mercaptoacetate); Pentaerythritol tetrakis(2-mercaptoacetate); Pentaerythritol tetrakis(3-mercaptopropionate); 2,2'-(Ethylenedioxy)diethanethiol; 1,3-Propanedithiol; 1,2-Ethanedithiol; 1,4-butanedithiol; 1,5-pentanedithiol; 1,6-hexanedithiol; 1,9-nonanedithiol; xylene dithiol; Thiobis(benzenethiol); 1,4-Butanediol bis(thioglycolate); 1,4-bis(3-mercaptobutylyloxy)butane; Tris[2-(3-mercaptopropionyloxy)ethyl] isocyanurate; 3,4-ethylenedioxythiophene; 1,10-Decanedithiol; Tricyclo[5.2.1.02,6]decanedithiol; Benzene-1,2-dithiol; Trithiocyanuric acid; 1-butanethiol; 1-hexanethiol; 1-heptanethiol; 1-octanethiol; 1-nonanethiol; 1-decanethiol; and 1-octadecanethiol.

Non-limiting examples of the second type of monomer include: Hexamethylene diisocyanate; isophorone diisocyanate; diisocyanatobutane; diisocyanatooctane; 1,3,5-Tris(6-isocyanatohexyl)-1,3,5-triazinane-2,4,6-trione; phenylene diisocyanate; xylylene diisocyanate; tolylene diisocyanate; cyclohexylene diisocyanate; toluene diisocyanate; methylenebis(phenyl isocyanate); propyl isocyanate; 1-pentyl isocyanate; hexyl isocyanate; octyl isocyanate; nonyl isocyanate; sec-butyl isocyanate; 2-ethylhexyl isocyanate; cyclopentyl isocyanate; and 1-isocyanato-3-methylbutane.

As further illustrated in the experiments described below, the range of compounds that the first and second type of monomer may be composed of, and their relative amounts used, provides a variety of approaches for adjusting crystallinity and hence toughness or other physical properties of the thiourethane polymers synthesized as described herein.

As a non-limiting example, in some embodiments, the amount of di-thiol functionalized monomers added to the mixture can be adjusted such that the mole percentage (mol %) of thiols contributed equals a percentage value in a range from 25 to 100 percent and in some embodiments 90 to 100 percent, and, the amount of tri-thiol or higher functionalized monomers added to the mixture is adjusted such that the mol % of thiols contributed equals a percentage value in a range from 75 to 0 percent, and in some embodiments 10 to 0 percent. In some such embodiments, the amount of the second type of monomer added to allow for a stoichiometric reaction to occur corresponds to 100 mol % from a di-isocyanate functionalized monomer. However, in other embodiments, it can be advantageous to provide off-stoichiometric ratios of total thiol functional groups to isocyanate functional groups, e.g., to give excess thiol or excess isocyanate functional groups. As another non-limiting example, in some embodiments, the amount of di-isocyanate functionalized monomers added to the mixture is adjusted such that the mol % of di-isocyanates contributed equals a percentage value in a range from 25 to 100 and in some embodiments, 90 to 100 percent and the amount of tri-isocyanate or higher functionalized monomers added to the mixture is adjusted such that the mol % of isocyanates contributed equals a percentage value in a range from 75 to 0 percent and in some embodiments 10 to 0 percent. In some such embodiments, the amount of the first type of monomer added to allow for a stoichiometric reaction to occur corresponds to 100 mol % from a di-thiol functionalized monomer. However, in other embodiments, it can be advantageous to provide off-stoichiometric ratios of total thiol functional groups to isocyanate functional groups, e.g., to give excess thiol or excess isocyanate functional groups.

As another non-limiting example, in some embodiments, when the di-thiol functionalized monomers added to the mixture are such that the mol % of thiols contributed from di-thiol functionalized monomer equals about 100 percent, and, the amount of di-isocyanate functionalized monomers added to the mixture is such that the mol % of isocyanates contributed from di-isocyanates functionalized monomer equals about 100 percent, then the resulting thiourethane polymer can be a thermoplastic polymer, and in some embodiments, a semi-crystalline thermoplastic polymer. In some embodiments, when the amount of the di-thiol functionalized monomers added to the mixture is such that the mol % of thiols contributed from di-thiol functionalized monomer is less than about 100 percent, and/or, the amount of di-isocyanate functionalized monomers added to the mixture is such that the mol % of isocyanates contributed from the di-isocyanate functionalized monomer equals less than about 100 percent, then the resulting thiourethane polymer can be a thermoset polymer, and in some embodiments, a semi-crystalline thermoset polymer. For example, in some embodiments, when the amount of the di-thiol functionalized monomers added to the mixture is such that the mol % of thiols contributed from di-thiol functionalized monomer equals about 97 to 90 percent (with the balance of thiol monomers being provided by a tri-thiol or higher functionalized monomer), and, the amount of di-isocyanate functionalized monomers added to the mixture is such that the mol % of isocyanates contributed from di-isocyanates functionalized monomer equals about 100 percent, then the resulting thiourethane polymer can be a semi-crystalline thermoset polymer.

Based on the present disclosure, one skilled in the pertinent art would understand how to vary the thiol and isocyanate group mol percentages by adjusting the amounts and types compounds corresponding to the first and second monomer types so as to synthesize a polythiourethane having the desired semicrystallinity and/or thermoset or thermoplastic characteristic and/or toughness and/or other physical property required for a particular application.

Still another embodiment of the disclosure is a method of synthesizing a semi-crystalline thiourethane polymer. FIG. 1 illustrates by flow diagram, selected aspects of an example method 100 of synthesizing semi-crystalline thiourethane polymers according to the principles of the present disclosure. The example method 100 comprises a step 110 of forming a mixture that includes a first type of monomer, a second type of monomer and a photolatent base. The first type of monomer includes two or more thiol functional groups and the second type of monomer includes two or more isocyanate functional groups. The method further comprises a step 120 of photo-initiating decomposition of the photolatent base to form a non-nucleophillic base catalyst having a pKa greater than 7 to thereby initiate step-growth polymerization (step 130) of the first type of monomer with the second type of monomers.

An advantageous feature of the method 100 is that embodiments of the synthesis steps 110, 120 can be conducted in either a non-anhydrous or anhydrous environment without detrimentally effecting the polymerization reaction. This is in contrast to some other polymerization synthesis systems where an anhydrous environment must be maintained, e.g., because isocyanate functionalized monomers, in the presence of a reaction environment that include a base to activate alcohol, can also react with water to form carbonates in a competing reaction. For instance, in some embodiments of the method 100, steps 110, 120 and the subsequent polymerization reaction (step 130) can be conducted in an air environment with up to 100 percent humidity, or can be conducted in an anhydrous environment such as a nitrogen atmosphere.

Another advantageous feature of the method 100 is that embodiments of the synthesis steps 110, 120 can be conducted in a solvent-free environment. That is, embodiments of the method 100 can be conducted in an environment where the mixture consists essentially of the first type of monomer, the second type of monomer and the photolatent base, with no other constituents present other than trace (e.g., less that 1% by weight and in some embodiments less then 0.1 wt percent) amounts of other materials (e.g., water, buffers or stabilizing agents) that do not participate in the polymerization reaction. This is contrast to some other polymerization synthesis systems where a solvent must be present. The ability to conduct the synthesis steps in a solvent-free environment is advantageous when the thiourethane polymer synthesized is a thermoset polymer because no further step needs to be taken to remove the solvent. This is in contrast to other applications where the removal of solvent from a thermoset polymer can result in the undesirable formation of voids in the polymer. However in other embodiments the presence of a solvent in the mixture may be advantageous e.g., to form such voids as part of forming a thermoset polymer foam.

As further illustrated in the experiments described below, it was discovered that in some embodiments some of the physical properties of the semi-crystalline thiourethane polymers can be modified by a post polymerization heat curing step 140 and a recrystallization step 150. For instance, in some embodiments of the heat curing step 140, a semi-crystalline thiourethane polymer can be heated at 10° C. min$^{-1}$ to 125° C. to eliminate the crystallites. For instance, in some embodiments, of the recrystallization step 150 such heat-cured polymers can be cooled at 10° C. min$^{-1}$ to 85° C. to form a recrystallized semi-crystalline thiourethane polymer. In some embodiments, the recrystallized semi-crystalline thiourethane polymer has lower (e.g., an about 16% reduction) percent crystallinity than the originally synthesized semi-crystalline thiourethane polymer. In some such polymers, the failure strain, toughness and tensile strength can accordingly reduced by about 12 to 15%.

In some embodiments, the cooling rate in the recrystallization step 150 can be important to regaining the crystallinity. While not limiting the scope of the disclosure by theoretical considerations, it is believed that cooling too fast to e.g., room temperature may lock polymer chains into a non-crystalline conformation. By cooling more slowly to e.g., 85° C. in some embodiments the polymer chains are provided with enough segmental motion to allow the polymer chains to align and reform crystallites.

The ability to treat the semi-crystalline thiourethane polymers above their crystalline melt temperature and substantially regain their crystallinity and mechanical properties upon recrystallization could advantageous in certain applications. For instance, in 3D printing applications a semi-crystalline thiourethane polymer synthesized as described herein could undergo further processing above its crystalline melt temperature and then be recrystallized to produce a re-crystallized polymer having substantially the same mechanical properties as originally synthesized polymer. Additionally, the post polymerization heat curing step and/or recrystallization step may provide a means to fine-tune the mechanical properties of the originally synthesized polymer.

Any embodiments of the method 100 can include any of the variations in the compositions and amounts of the first and second types of monomers and photolatent bases and the physical conditions for polymerization, curing and recrystallization as disclosed herein.

In any embodiments of the method 100 a third type of monomer may be added to the mixture where the third type of monomer each has a single thiol functional group or a single isocyanate functional group. Such mono-functionalized monomers may be used to facilitate chain capping and branched networks in the thiourethane polymer.

Figure 2A:
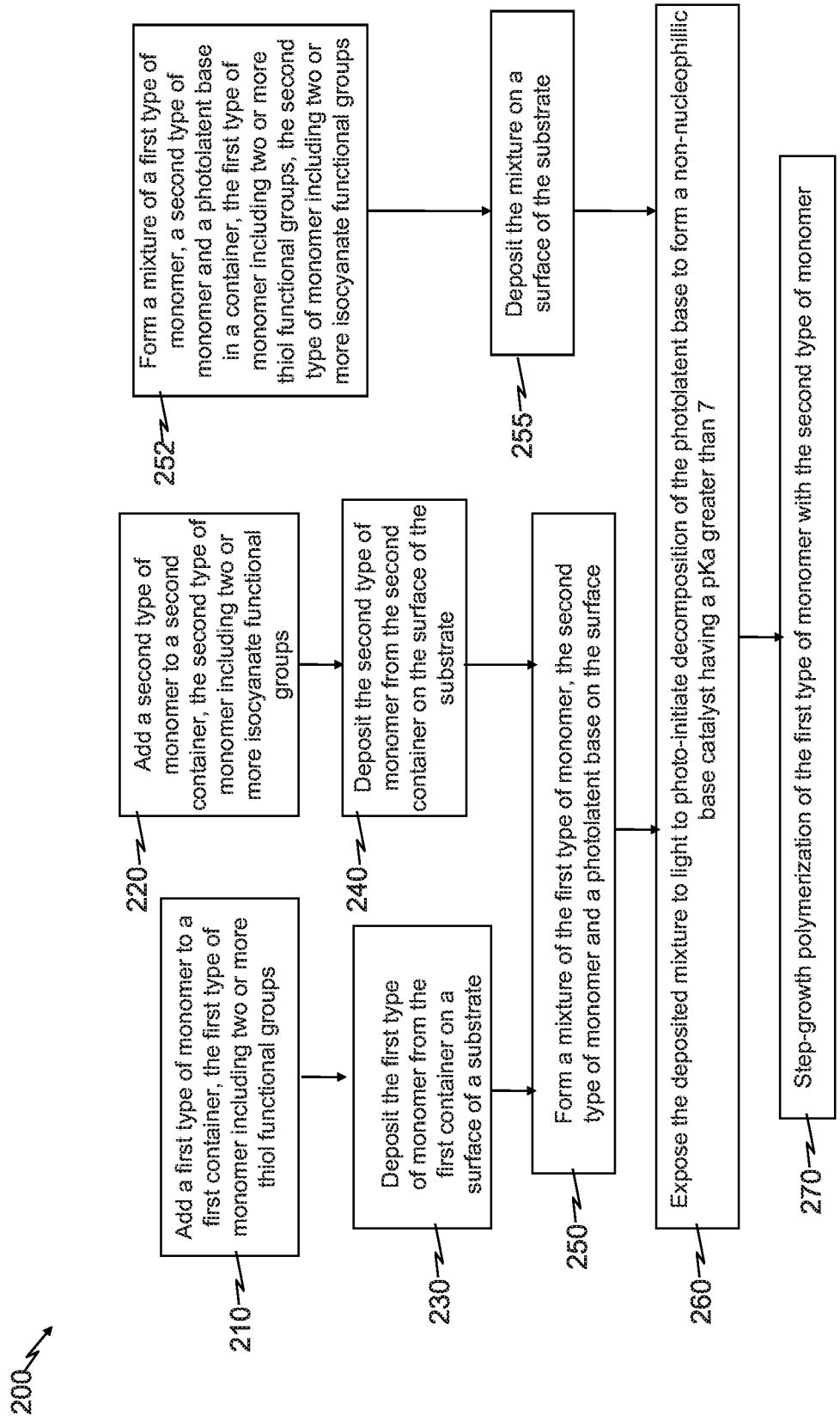
FIG. 2A illustrates by flow diagram, selected aspects of an example polymer jetting method of manufacturing a polymer part according to the principles of the present disclosure.

Still another embodiment of the disclosure is a polymer jetting method of manufacturing a polymer part. FIG. 2A illustrates by flow diagram, selected aspects of an example jetting method 200 of manufacturing a polymer part that includes semi-crystalline thiourethane polymers, according to the principles of the present disclosure.

The example method 200 comprises a step 260 of exposing a deposited mixture to light to photo-initiate decomposition of a photolatent base in the mixture to form a non-nucleophillic base catalyst having a pKa greater than 7 to thereby initiate step-growth polymerization (step 270) of a first type of monomer with a second type of monomer to thereby form a semi-crystalline thiourethane polymer part. The first type of monomer includes two or more thiol functional groups and the second type of monomer includes two or more isocyanate functional groups.

Some embodiments of the method 200 can further include a step 210 of adding the first type of monomer to a first container and a step 220 of adding the second type of monomer to a second container. Some such embodiments of the method 200 can further include a step 230 of depositing the first type of monomer from the first container on a surface of a substrate, and step 240 of depositing the second type of monomer from the second container on the substrate surface such that the first type of monomer, the second type of monomer and a photolatent base form a mixture (e.g., the deposited mixture) on the surface (step 250) during the depositing (e.g., either or both of steps 230, 240). In some embodiments, one or both of the first and second containers further include the photolatent base, while in other embodiments the photolatent base may be separately added to form the mixture. For example, in some embodiments, the containers may further in include dyes, inhibitors or stabilizers.

Some embodiments of the method 200 can further include a step 252 of forming a mixture of a first type of monomer, a second type of monomer and a photolatent base in a container. Some such embodiments of the method 200 can further include a step of depositing the mixture on a surface of the substrate to thereby form the deposited mixture.

In some such embodiments, the substrate can be a mold configured to hold the mixture and the photo-initiation step is performed layer-by-layer. In some embodiments, as part of the depositing steps 230, 240, the contents of the first container and second container can be directed to common or separate spray nozzles configured to spray the individual first and second types monomers or the mixture as thin layers on the substrate and multiple different photo-initiation steps 260 can be performed as each thin layer is deposited on the substrate surface.

Figure 2B:
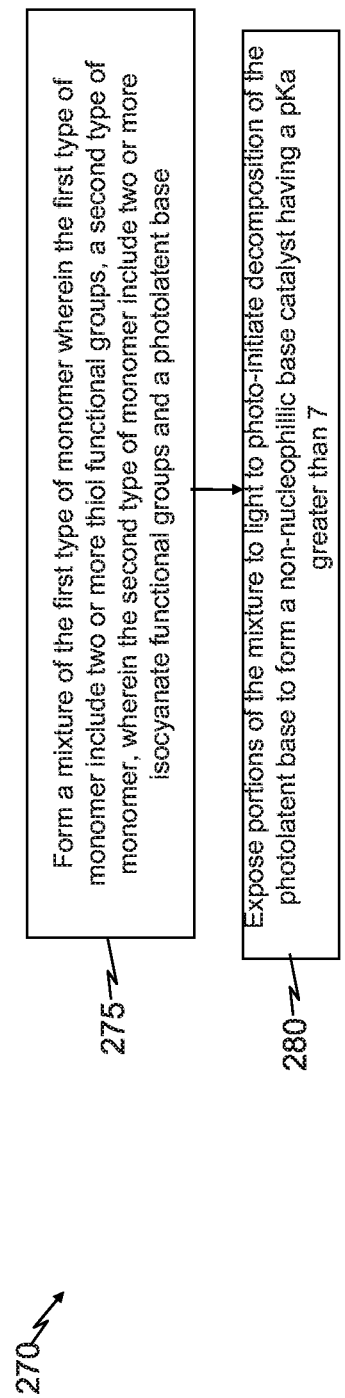
FIG. 2B illustrates by flow diagram, selected aspects of an example stereolithography method of manufacturing a polymer part according to the principles of the present disclosure.

Yet another embodiment of the disclosure is a stereolithography method of manufacturing a polymer part. FIG. 2B illustrates by flow diagram, selected aspects of an example stereolithography method 270 of manufacturing a polymer part that includes semi-crystalline thiourethane polymers, according to the principles of the present disclosure.

The method comprises a step 275 of forming a mixture of a first type of monomer, wherein the first type of monomer include two or more thiol functional groups, a second type of monomer, wherein the second type of monomer include two or more isocyanate functional groups, and a photolatent base. The method further comprises a step 280 of exposing the portions of the mixture to light to photo-initiate decomposition of the photolatent base to form a non-nucleophillic base catalyst having a pKa greater than 7 to thereby initiate step-growth polymerization of the first type of monomer with the second type of monomers. In some embodiments the exposure to light as part of step 280 can include light from a singular rastered laser while in other embodiments the exposure to light as part of step 280 can include patterned light projection (e.g., DLP). For instance, these procedures can be used as part of step 280 to expose discrete layers of the mixture being held in a container.

The methods 200, 270 can include any of the variations in the compositions and amounts of the first and second types of monomers and photolatent bases and the physical conditions for polymerization, curing and recrystallization and the method of synthesis steps (e.g., method 100) as disclosed herein.

To facilitate understanding of various features of the disclosure, the structures and acronyms of some of the example monomers and photolatent bases referred to in the text and figures are presented below:

Thiol-Functionalized Monomers:
Name: 1,2'-ethanedithiol
Acronym: EDT

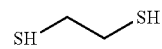

Name: 1,5'-pentanedithiol
Acronym: PDT

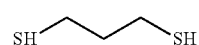

Name: 1,6'-hexanedithiol
Acronym: HDT

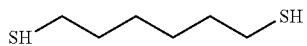

Name: 1,10'-decanedithiol
Acronym: DDT

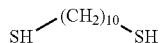

Name: tricyclodecanedithiol
Acronym: TCDDT

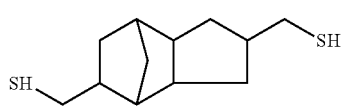 [SMILES: SCC1CC2C3CC(CS)C(C3)C2C1]

Name: 2,2'-thiodiethanethiol
Acronym: TDET

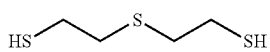

Name: 2,2'-(ethylenedioxy)diethanethiol
Acronym: EDDT

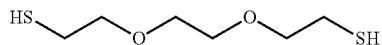

Name: 1,4-bis (3-mercaptobutylyloxy) butane
Acronym: BD1

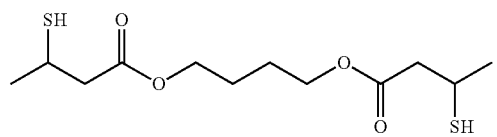 [SMILES: CC(S)CC(=O)OCCCCOC(=O)CC(C)S]

Name: Tris[2-(3-mercaptopropionyloxy)ethyl] isocyanurate
Acronym: TMICN

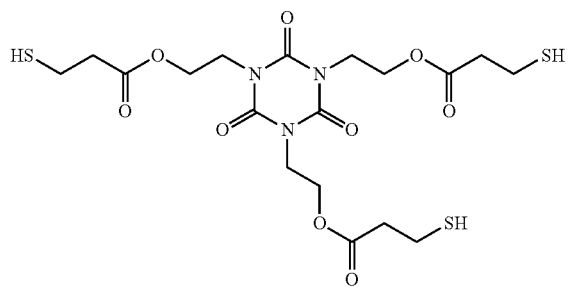 [SMILES: O=C(CCS)OCCn1c(=O)n(CCOC(=O)CCS)c(=O)n(CCOC(=O)CCS)c1=O]

Name: Trimethylolpropane tris(3-mercaptopropionate)
Acronym: TMTMP

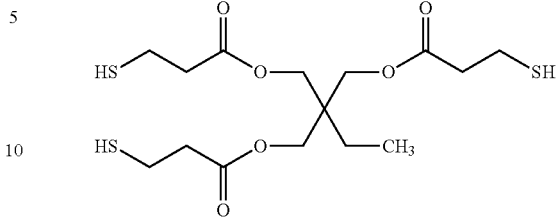

Name: Pentaerythritol tetrakis(3-mercaptopropionate)
Acronym: PETMP

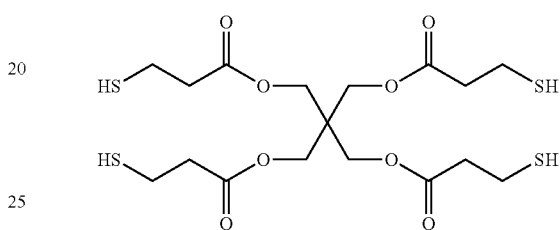

Isocyanate-Functionalized Monomers:
Name: Hexamethylene diisocyanate
Acronym: HDI

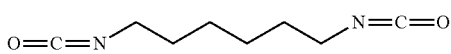

Name: Isophorone diisocyanate
Acronym: IDI

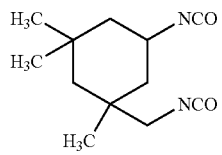

Name: Tris(6-isocyanatohexyl)isocyanurate
Acronym: HDI-T

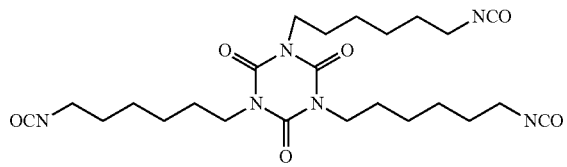

Name: m-Xylylene diisocyanate
Acronym: XDI

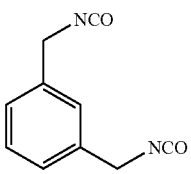

Name: Tolylene-2,4-diisocyanate
Acronym: TDI

Photolatent Bases:

Name: 1,1-Dimethyl-1-(2-hydroxy-3-phenoxypropyl)amine p-nitrobenzimide
Acronym: DANBA
Catalyst photo-released: Unidentified tertiary amine

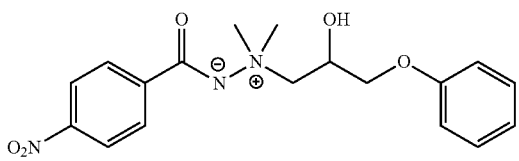 [SMILES: C[N+](C)(CC(O)COc1ccccc1)[N-]C(=O)c1ccc([N+](=O)[O-])cc1]

Name: not yet assigned
CAS: 1857358-47-4

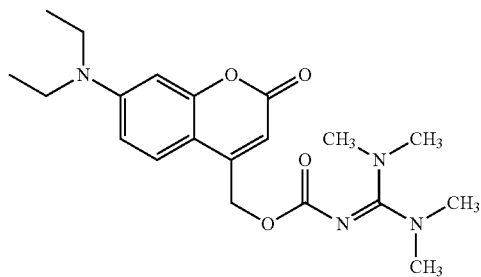 [SMILES: CCN(CC)c1ccc2c(COC(=O)N=C(N(C)C)N(C)C)cc(=O)oc2c1]

Name: Benzeneethanaminium, N, N, N-triethyl-β-oxo-, tetraphenylborate(1-) (9Cl)
CAS: 212753-21-4
Acronym: BTOTPB
Catalyst photo-released: triethylamine

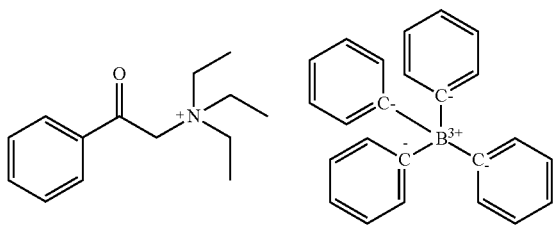

Name: 2-Naphthaleneethanaminium, N, N, N-triethyl-β-oxo-, tetraphenylborate(1-) (9Cl)
CAS: 376644-79-0
Acronym: NTOTPB
Catalyst photo-released: triethylamine

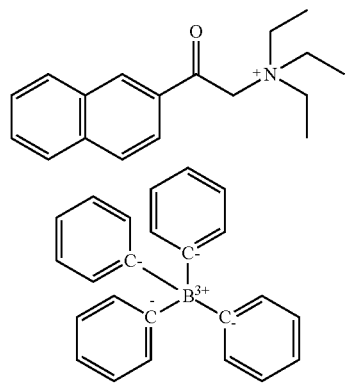

Name: 1-Pyreneethanaminium, N, N, N-triethyl-β-oxo-, tetraphenylborate(1-) (9Cl)
CAS: 1532544-49-2
Acronym: PTOTPB
Catalyst photo-released: triethylamine

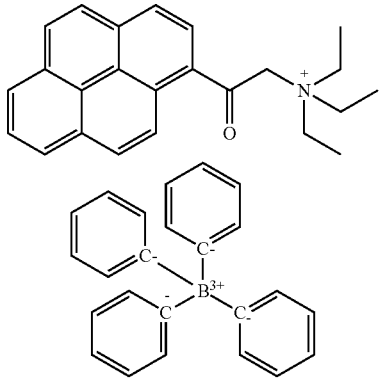

Name: Benzenemethanaminium, 4-benzoyl-N, N, N-triethyl-, tetraphenylborate(1-) (9Cl)
CAS: 216067-03-7
Acronym: BBTTPB
Catalyst photo-released: triethylamine

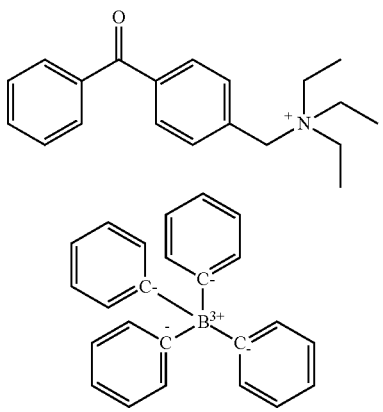

Name: 9H-Thioxanthene-2-methanaminium, N, N, N-triethyl-9-oxo-, tetraphenylborate(1-) (9Cl)
CAS: 929895-20-5
Acronym: TMTOTPB Catalyst photo-released: triethylamine

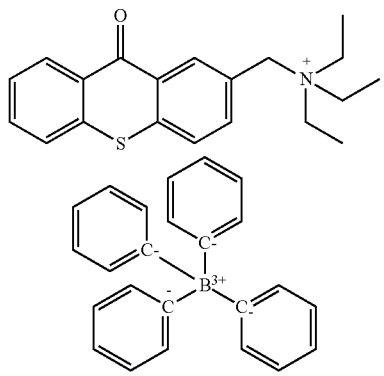

For any of the photolatent bases BTOTPB, NTOTPB, PTOTPB, BBTTPB or TMTOTPB the triethylamine substituent may be replaced by any one of the following substituents:

1,8-Diazabicyclo[5.4.0]undec-7-ene

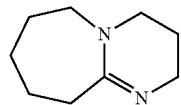

1,5-Diazabicyclo[4.3.0]non-5-ene

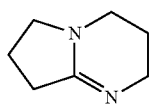

Tributylamine

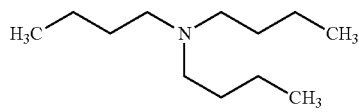

4-(Dimethylamino)pyridine

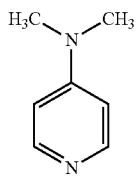

1,4-Diazabicyclo[2.2.2]octane

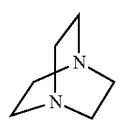

1,1,3,3-Tetramethylguanidine

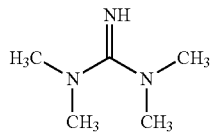

Additionally, or alternatively, for any of the photolatent bases BTOTPB, NTOTPB, PTOTPB, BBTTPB or TMTOTPB the tetraphenylborate anion substituent may be substituted by the following substituent:

Borate(1-), butyltriphenyl-, (T-4)-

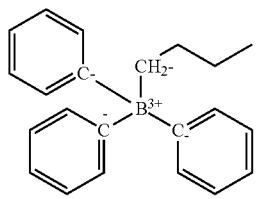

To further illustrate various features of the disclosure, the synthesis of non-limiting example thiourethane polymers and some of their physical and mechanical properties are presented below.

Experiment 1

Example Polythiourethane Synthesis

In one series of experiments, the photobase generator DANBA was measured out to equal 0.5 wt % of the expected mass of the monomer mixture and added to a covered scintillation vial. The example EDDT and PETMP thiol monomers were added to the vial, which was then mixed in a FlackTek DAC 400 speedmixer for five minutes at 2000 rpm. The example HDI isocyanate monomer was then added to the mixture, which was again mixed in a FlackTek DAC 400 speedmixer for five minutes at 2000 rpm. Preparing films of the polymer samples included locating (e.g., by injecting or pipetting) the mixture between a mold corresponding to two glass slides (3"×2") separated by a 0.6 mm spacer for all tests aside from uniaxial tensile testing. Samples for tensile testing for were prepared by locating the mixture between two glass slides (5"×4") separated by a 1.1 mm spacer. After placing the mixture in the mold, the mixture was then cured under 365 nm light at ambient temperature for 90 minutes to initiate rapid polymerization to form the polymer sample. Each polymer sample was then post-cured at 85° C. under vacuum for at least 12 hours.

The amounts of PETMP, EDDT and HDI monomers added to the vials were adjusted so as to provide different target mole percentages of thiol and isocyanate functional groups contributed from these monomers in the polymerization reaction. Table 1 shows the different target mole percentages of thiol and isocyanate functional group loading fractions contributed from each of the PETMP, EDDT and HDI monomers for the different types polythiourethane polymer samples synthesized.

TABLE 1 mol percentages of thiol and isocyanate functional group contributions for different sample polymers

| Sample | PETMP | EDDT | HDI |
| --- | --- | --- | --- |
| EH | 0 | 100 | 100 |
| PEH-1 | 3 | 97 | 100 |
| PEH-2 | 5 | 95 | 100 |
| PEH-3 | 10 | 90 | 100 |
| PEH-4 | 15 | 85 | 100 |
| PEH-5 | 20 | 80 | 100 |
| PEH-6 | 30 | 70 | 100 |

Physical and Mechanical Property Tests

Differential scanning calorimetry (DSC) measurements were performed on a Mettler Toledo (Columbus, Ohio) DSC 1 in a 40 μL aluminum crucible. To measure Glass Transition Temperature (Tg) the polythiourethane polymer samples were cooled from room temperature to −50° C. and heated to 200° C. Each sample was then cooled back down to −50° C. and heated to 200° C. for two more cycles. All heating and cooling rates were fixed at 10° C. min 1. All tests were conducted in a nitrogen atmosphere. A second heating ramp was performed as described below. Tg is denoted as the midpoint of the transition. The average value of at least three separate tests done on each sample is reported herein.

Samples of the PEH-1 polymer were cooled from room temperature to −50° C. and heated to 125° C. The sample was then cooled back down to −50° C. and heated to 125° C. to show elimination of the crystallites. The sample was then cooled to 85° C. and annealed for 24 hours. The sample was then cooled to −50° C. and heated to 125° C. The percent recovery was recorded as the integrated area of the crystal melt endotherm after annealing compared to that of the original melt. All heating and cooling rates were fixed at 10° C. min$^{-1}$. All tests were conducted in a nitrogen atmosphere. The average value of at least three separate tests done on the sample is reported herein.

Thermogravimetric analysis (TGA) was performed on a Mettler Toledo TGA/DSC 1 in a 70 μL alumina crucible. All tests were conducted in a nitrogen atmosphere. Samples were heated from room temperature to 700° C. at a rate of 10° C. min-1. The average value of at least three separate tests done on each sample is reported herein.

Dynamic mechanical analysis (DMA) was performed on a Mettler Toledo (Columbus, Ohio) DMA 861e/SDTA. Three samples of each polymer composition were cut into rectangular bars approximately 20 mm in length, 3 mm in width and a thickness of approximately 0.6 mm. The mode of deformation was tension. Force was limited to 10 N and deformation was limited to 55 μm. Samples were tested between −50° C. and 150° C. at a heating rate of 2° C. min$^{-1}$. The frequency of deformation was 1 Hz. The tan δ and storage modulus E' of the samples were recorded with respect to temperature. Tg determined by DMA is denoted as the peak of tan δ.

Uniaxial tensile testing was performed on a Lloyd Instruments (West Sussex, UK) LR5K Plus Universal Materials Testing Machine with a 500 N load cell and Laserscan 200 laser extensometer. Samples were cut into dog-bone shapes according to ASTM standard D-638-V. At least four samples of each sample polymer were strained at a rate of 50 mm min$^{-1}$ until sample failure. Tensile strength was taken as the maximum stress experienced by the polymer. Toughness was taken as the area under the stress-strain curve from the origin to the point of failure. For temperature dependent tests, the sample was brought to the target temperature and isothermed for at least five minutes before the test was conducted. Recrystallization samples were annealed at 125° C. for two hours to remove crystallites and cooled to 85° C., where they were held for 24 hours before quenching to room temperature.

Results

Figure 3:
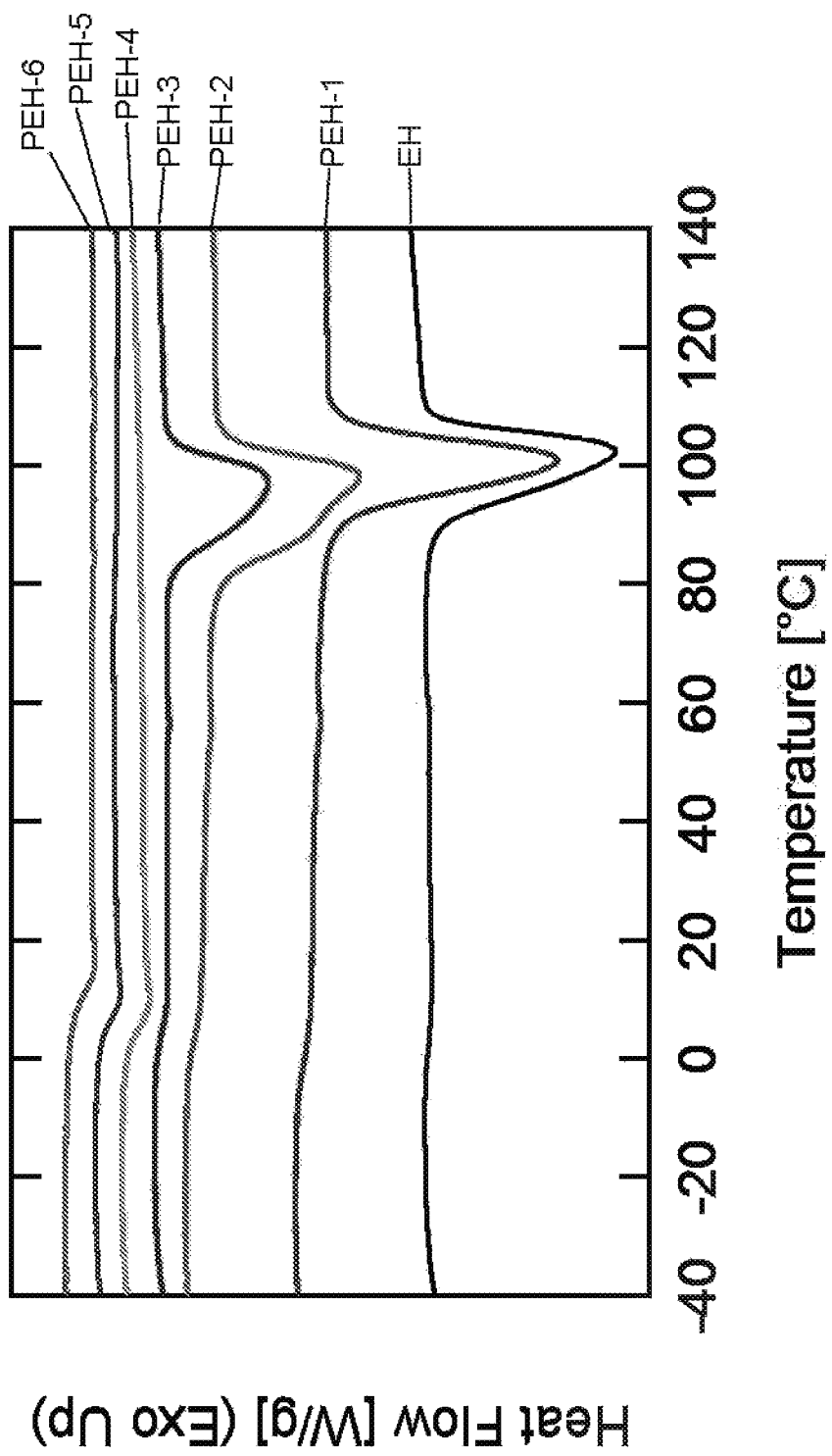
FIG. 3 presents example differential scanning calorimetry first heating ramps of example thiourethane polymer samples synthesized as described in the context of Table 1 according to the principles of the present disclosure.

FIG. 3 presents example DSC first heating ramps performed on each of the different sample polymers described in the context of TABLE 1. The DCS data provides information about the glass transition temperature and crystallinity of the samples. Crystal melt endotherms near 100° C. are visible for samples EH, PEH-1, PEH-2, and PEH-3. Samples PEH-4, PEH-5, and PEH-6 show no melt endotherm throughout the test.

As illustrated the size of the crystal melt exotherms tend to decrease as the thiol fraction of PETMP increases, indicating lower degrees of crystallinity for more highly cross-linked samples. This suggests that the PETMP molecule may not only refrain from crystallization but may inhibit crystallization at thiol functional groups loading fractions from PETMP corresponding to about 15 mol % and higher. While not limiting the scope of the disclosure by theoretical considerations, it is thought that crystals in the polymer may be formed by linear EDDT-HDI segments of the polymer chain. It is thought that increasing amounts of the PETMP monomer having greater that two thiol functional groups promotes the increasing amounts of cross-linking between polymerizing polymer chains thereby reducing the length or number of such linear EDDT-HDI segments. As the relative amount of PETMP increases towards 15 mol %, there may no longer be a sufficient number of linear EDDT-HDI segments long enough to crystallize, thereby resulting in non-crystalline amorphous polymers.

Notably, while all of these samples are aliphatic thiol-isocyanate polymers and yet samples EH, PEH-1, PEH-2, and PEH-3 have indications of crystallinity. This is in contrast to some urethanes and thiourethanes polymers where crystallinity is promoted by the addition of monomers containing aromatic rings which may stack as part of forming crystallites and may serve as physical crosslinks or improve mechanical properties.

Figure 4:
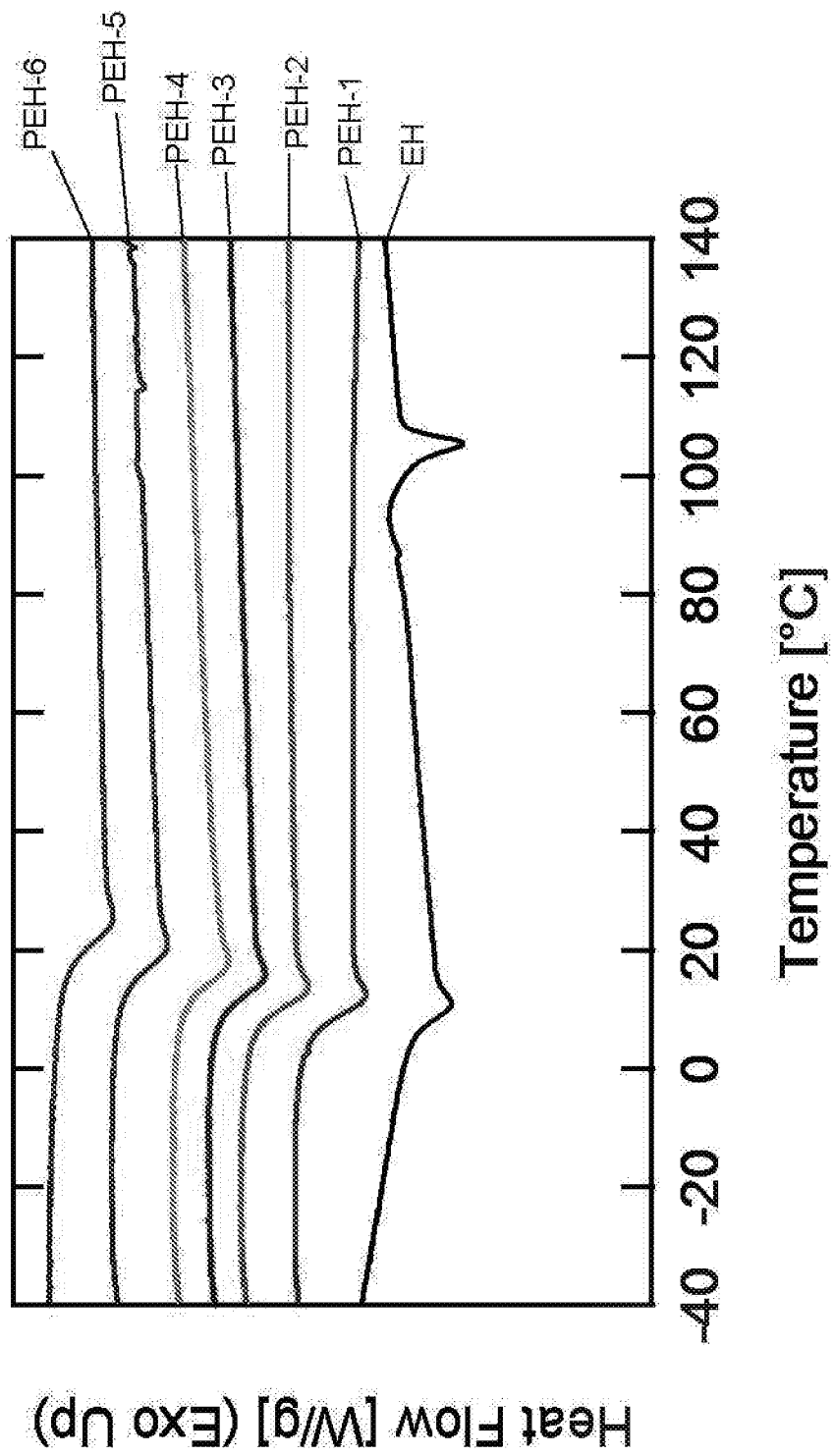
FIG. 4 presents example differential scanning calorimetry second heating ramps of the same example thiourethane polymers as described in the context of FIG. 3.

FIG. 4 presents example DSC second heating ramps of the same example thiourethane polymers as described in the context of FIG. 3. Each of the samples have undergone a primary heating ramp and as illustrated in FIG. 4, the melt endotherm has disappeared for the crosslinked polymers PEH-1 to PEH-6. The glass transition temperatures determined from data such as shown in FIG. 4 are summarized in TABLE 2 (Tg by DSC).

TABLE 2

Glass transition temperature as determined by DMA and DSC, and degradation onset as determined by TGA

| Sample | $T_g$ by DMA (° C.) | $T_g$ by DSC (° C.) | Degradation Onset by TGA (° C.) |
| --- | --- | --- | --- |
| EH | 7.17 ± 1.89 | 7.37 ± 0.15 | 277.93 ± 4.08 |
| PEH-1 | 8.82 ± 2.16 | 7.61 ± 0.19 | 281.86 ± 2.54 |
| PEH-2 | 8.49 ± 0.51 | 9.23 ± 0.08 | 276.93 ± 1.31 |
| PEH-3 | 13.81 ± 0.96 | 10.86 ± 0.08 | 271.23 ± 3.88 |
| PEH-4 | 11.30 ± 0.66 | 13.20 ± 0.77 | 274.65 ± 5.07 |
| PEH-5 | 14.58 ± 0.44 | 15.33 ± 0.23 | 273.85 ± 1.22 |
| PEH-6 | 19.49 ± 0.79 | 20.78 ± 1.33 | 281.83 ± 3.53 |

As the load fraction of thiol functional groups from PETMP in the sample increases, Tg increases similarly. Notably, the crystal melt endotherms seen in the initial heating ramp (FIG. 3) are no longer present in all samples except for EH (FIG. 4). For this sample a small melt is seen at 105° C., which disappears in subsequent cycles. This behavior is contrary to aliphatic semi-crystalline polymers such as Nylon that will spontaneously recrystallize upon cooling. However, Nylons tend to have crystal melt temperatures between 150° C. and 300° C. The particularly low melting temperature of this material in addition to the lack of recrystallization suggests that the crystallites have a relatively low energetic favorability compared to polymers such as Nylon.

While not limiting the scope of the disclosure by theoretical considerations, it is thought that the inclusion of oxygen in the polymer backbone due to EDDT may disrupt orderly packing of the linear segments to some degree. This in turn may reduce the thermal energy necessary to melt the crystallites and discourage recrystallization unless slow cooling rates were used. This suggests the possibility of increasing the melt temperature and improving crystallization hysteresis by replacing some or all the EDDT monomer with an oxygen-free structural analogue monomer. The ability to precisely control melting point could be useful in applications where adjusting the melting point above a certain is important to product performance such as fused filament fabrication (FFF) 3D printing.

Thermomechanical Properties

Figure 5:
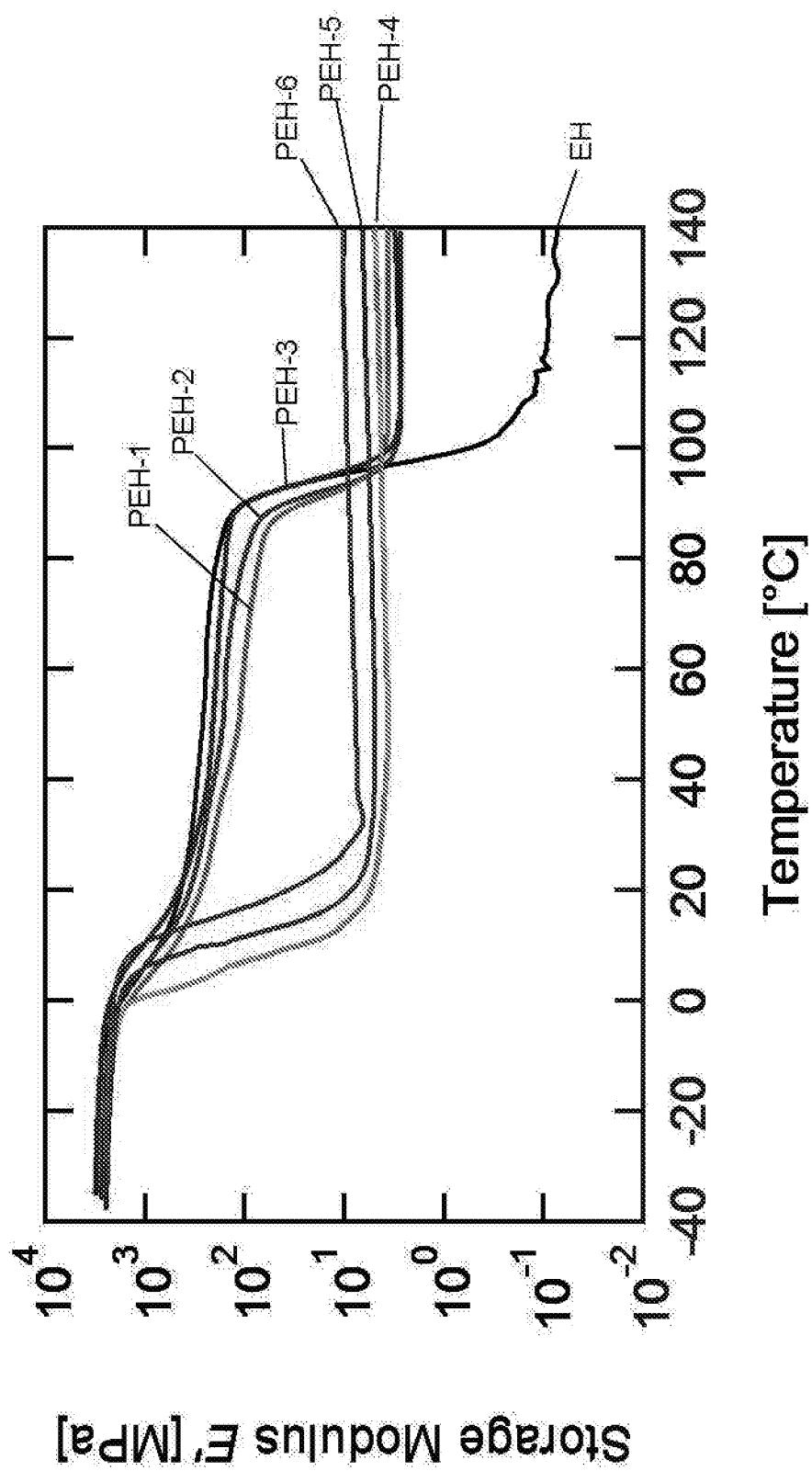
FIG. 5 presents example tensile storage modulus values as a function of temperature for the same example thiourethane polymers as described in the context of FIG. 3.
Figure 6:
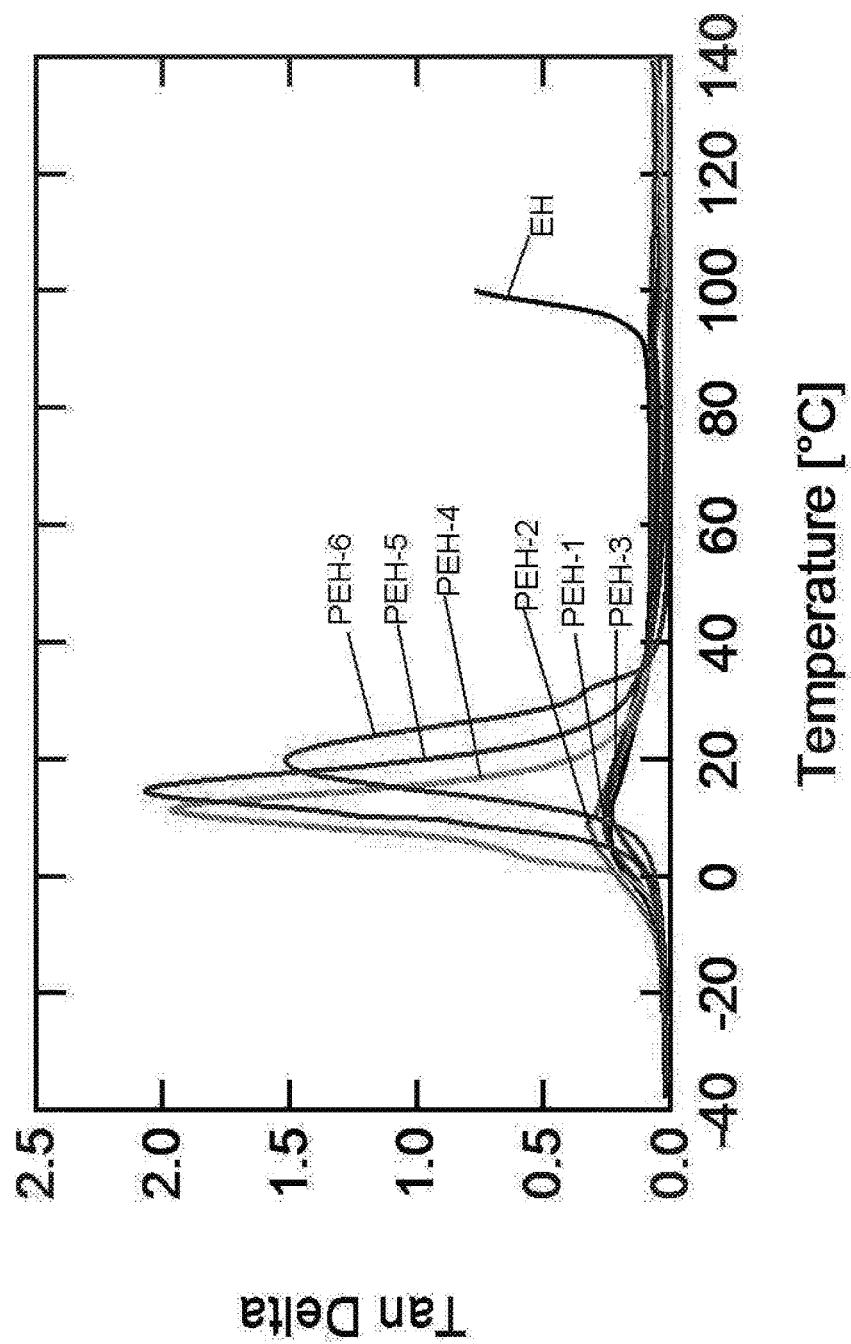
FIG. 6 presents example Tan delta values as a function of temperature for the same example thiourethane polymers as described in the context of FIG. 3.

FIGS. 5 and 6 present example tensile storage modulus example Tan delta values, respectively, as a function of temperature for the same example thiourethane polymers as described in the context of FIG. 3. As illustrated, the glassy modulus shows a dependence on the sample's crystallinity. The non-crystalline amorphous polymer sample PEH-4, PEH-5 and PEH-6 through have rubbery moduli of about 2400 MPa. This is higher than some photocured thiol-ene polymers networks, which can have a glassy Young's modulus of about 1600 MPa. The samples having some crystallinity (EH, PEH-1, PEH-2, PEH-3) have glassy modulus up to about 3000 MPa, nearly double that of the aforementioned thiol-ene networks. Thiourethane polymers have such a glassy modulus may be advantageous in applications where mechanical stiffness is valuable, such as polymer parts that require a minimum buckling stiffness. Polymer parts having such a high glassy modulus may allow the fabrication devices (e.g., implantable tissue probes) with lower thicknesses while maintaining the requisite stiffness. This in turn may increasing device performance and stability over time.

As further illustrated, the modulus of the region between the glass transition and crystalline melt varies between 100 MPa and 250 MPa. The modulus in this region shows indications of dependence on both the overall crystallinity of the sample and the loading fraction of thiol functional groups from the PETMP monomer. Small amounts of added PETMP monomer (e.g., sample PEH-1) results in a polymer have a much lower modulus as compared to polymer sample EH having no PETMP monomers. While not limiting the scope of the disclosure by theoretical considerations, it is thought that this may be due to the reduction in crystallinity that accompanies the addition of crosslink-promoting PETMP monomer, e.g., as discussed in the context of FIG. 3. The ability to control rubbery modulus by adjusting the crystallinity of such thiourethane polymers may advantageously allow the use of fine thermal treatment before, during, or after processing to adjust the mechanical properties of polymer parts fabricated from such polymers.

As further illustrated, the modulus, beyond the crystal melt, show indications of dependence on the polymer crosslink density, as all of polymer samples synthesized with the PETMP monomer present have non-crystalline amorphous properties. The polymer samples with low amounts of the crosslink-promoting PETMP monomer such as PEH-1 or PEH-2 have rubbery moduli near about 3 MPa, while polymer samples having higher amounts of the crosslink-promoting PETMP monomer such as PEH-5 or PEH-6 have about double a rubbery modulii of about 6 MPa. By further increasing amount of crosslinking through the use of higher amount of addition of PETMP it is believed that the rubbery modulus could adjusted to over 10 MPa. In some embodiments it may be advantageous to fabricate a polymer part (e.g., implantable tissue probes) by such synthesis process to produces a part having higher glassy modulus pre-implantation but a lower rubbery modulus post-implantation.

As further illustrated, sample PEH-3, which, despite having more crosslink-promoting PETMP monomer than some of the other semi-crystalline samples, also has a modulus approximately equal to that of sample EH in the region between the glass transition and crystalline melt. This may suggest that PEH-3 has a higher degree of crystallinity than PEH-1 and PEH-2. PEH-3 also has an amorphous rubbery modulus as low as the expected least crosslinked sample, PEH-1. One would expect the rubbery modulus to be purely dependent on the crosslink density and be somewhere between that of PEH-2 and PEH-4. It is possible that at this loading fraction of PETMP crosslinker, an incomplete cure occurs, and the 85° C. post-cure does not bring to completion.

As further illustrated, the tan delta peaks shift upward as the fraction of the PETMP monomer fraction in the samples is increased, corresponding to the increasing glass transition temperatures. It is thought that only the amorphous fraction of the polymer samples undergo a glass transition and contributes to the tan delta peak during the transition. The magnitudes of the tan delta peaks are thus thought to be indicative of the amount crystallinity in the samples. Semi-crystalline samples such as EH, PEH-1, PEH-2, and PEH-3 have low peak magnitudes, not exceeding 0.32. Conversely, the non-crystalline amorphous polymer samples PEH-4, PEH-5 and PEH-6 have large peak magnitudes. These samples have peak heights up to 2.0 and full-width half-max values around 10° C., suggesting a high degree of network homogeneity and sharp glass transitions.

Figure 7:
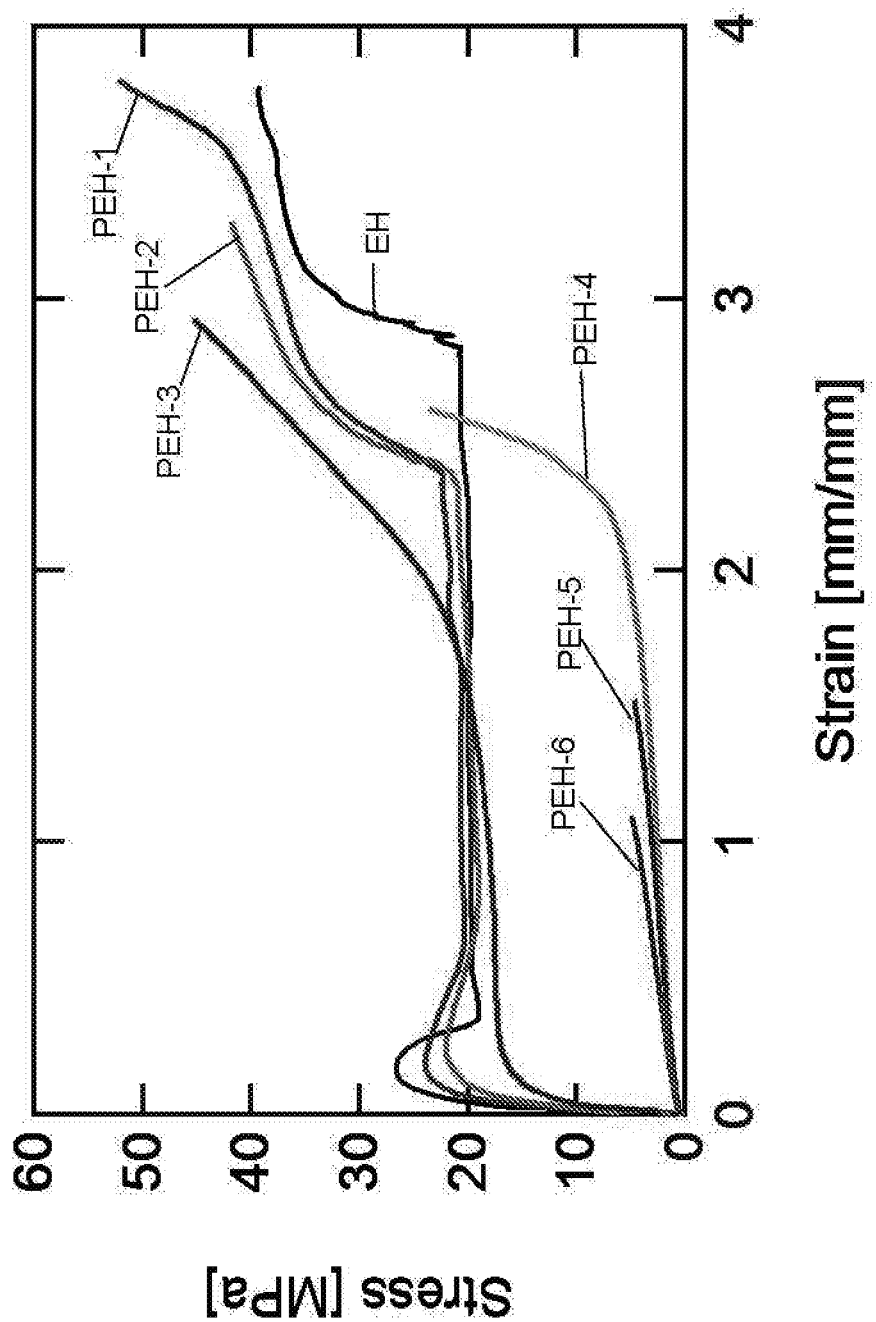
FIG. 7 presents example Tensile stress versus strain behavior at 20° C. for the same example thiourethane polymers as described in the context of FIG. 3.

FIG. 7 presents example tensile stress versus strain behavior at 20° C. for the same example thiourethane polymers as described in the context of FIG. 3. TABLE 3 presents averages and standard deviations of tensile strength, failure strain, and toughness of these polymer samples.

TABLE 3

Tensile strength, failure strain, and toughness of polythiourethane samples

| Sample | Tensile Strength (MPa) | Failure Strain (%) | Toughness (MJ m$^{-3}$) |
| --- | --- | --- | --- |
| EH | 40.10 ± 2.17 | 385.71 ± 42.90 | 99.25 ± 17.21 |
| PEH-1 | 48.96 ± 5.09 | 376.14 ± 27.48 | 99.27 ± 10.62 |
| PEH-2 | 40.12 ± 2.53 | 323.93 ± 18.27 | 76.35 ± 6.95 |
| PEH-3 | 44.55 ± 3.44 | 293.07 ± 7.49 | 67.59 ± 4.28 |
| PEH-4 | 18.91 ± 4.98 | 261.38 ± 5.33 | 11.30 ± 0.70 |
| PEH-5 | 4.24 ± −0.44 | 140.48 ± 18.77 | 3.42 ± 0.66 |
| PEH-6 | 5.10 ± 0.64 | 110.80 ± 6.08 | 3.13 ± 0.40 |

Semi-crystalline samples such as EH, PEH-1, PEH-2, and PEH-3 have large initial moduli before yielding at about 15% to 20% strain (about 0.15 to 0.2 mm/mm in FIG. 7). The yield stress increases with the degree of crystallinity, from about 15 MPa for sample PEH-3 to about 28 MPa for sample EH. After a brief decline in the stress, it plateaus at a value suggestive of a relationship to the sample's degree of crystallinity. A secondary stress increase and yield is then seen between 200% and 300% strain before failing at strains often over 400%. This secondary stress increase suggests a relationship to degree of the crosslink density, with the thermoplastic EH sample remaining in the stress plateau until almost 300% strain. Samples PEH-1 and PEH-2, expected to have the lowest crosslink density, have longer stress plateaus than the more highly crosslinked PEH-3. PEH-3 shows mixed-mode behavior; showing a clear yield point but showing a less prominent plateau region after yielding until failing at 290% strain and 45 MPa. This may suggest that PEH-3 has a PETMP loading fraction near the limit of allowing crystallinity, which agrees with the DSC data discussed in the context of FIG. 3. The semi-crystalline samples EH, PEH-1, PEH-2, and PEH-3 have favourable tensile properties as compared to certain the toughest aromatic thiol-isocyanate thermoplastics, having tensile strengths between 20 and 40 MPa and failure strains between 200% and 650%. Samples EH and PEH-1 have very high tensile strength, failure strain, and toughness. Both types of samples have tensile strengths above 40 MPa, failure strains near 380%, and toughness approaching 100 MJ m$^{-3}$. The non-crystalline amorphous polymer samples PEH-4, PEH-5 and PEH-6 samples exhibited lower moduli and do not have a yield point, suggesting elastomeric behavior. Sample PEH-4 shows a linear increase in stress up to 220% strain, where the slope rapidly increases before failing at 19 MPa and 260% strain. Samples PEH-5 and PEH-6 show purely linear behavior; failing at 4.6 MPa and 150% strain, and 4.8 MPa and 110% strain.

Based of the analysis presented herein we believe that samples PEH-1, PEH-2, and PEH-3 exhibit the properties of semi-crystalline crosslinked thermoset polymers and sample EH exhibits the properties of a semi-crystalline thermoplastic polymer. Both of these thermoplastic and thermoset samples and variants are believed to have promise for applications such as photo-curable impact absorption materials and 3D printing resins. For instance, the high toughness of sample EH suggests advantageous use as a printing materials, having similar tensile strength (e.g., 40 MPa) but lower processing temperatures (e.g., melting point less than 60° C.) and higher failure strains (e.g., greater than 10%) as compared to other printing materials such as polycaprolactone and polylactic acid. For instance, the similar tensile strength (e.g., 40 MPa) but high toughness, higher failure strain (e.g., greater than 40%) and rapid curing rates of sample PH-1 suggests advantageous use as a stereolithography resin as compared to some conventional photopolymer resins. The low viscosity of the monomers mixture as compared to some conventional photopolymer resins also lends itself well to the stereolithography process which benefit from the use of a solution that is able to reflow over the cured resin during the printing process.

Recrystallization Characteristics

Figure 8:
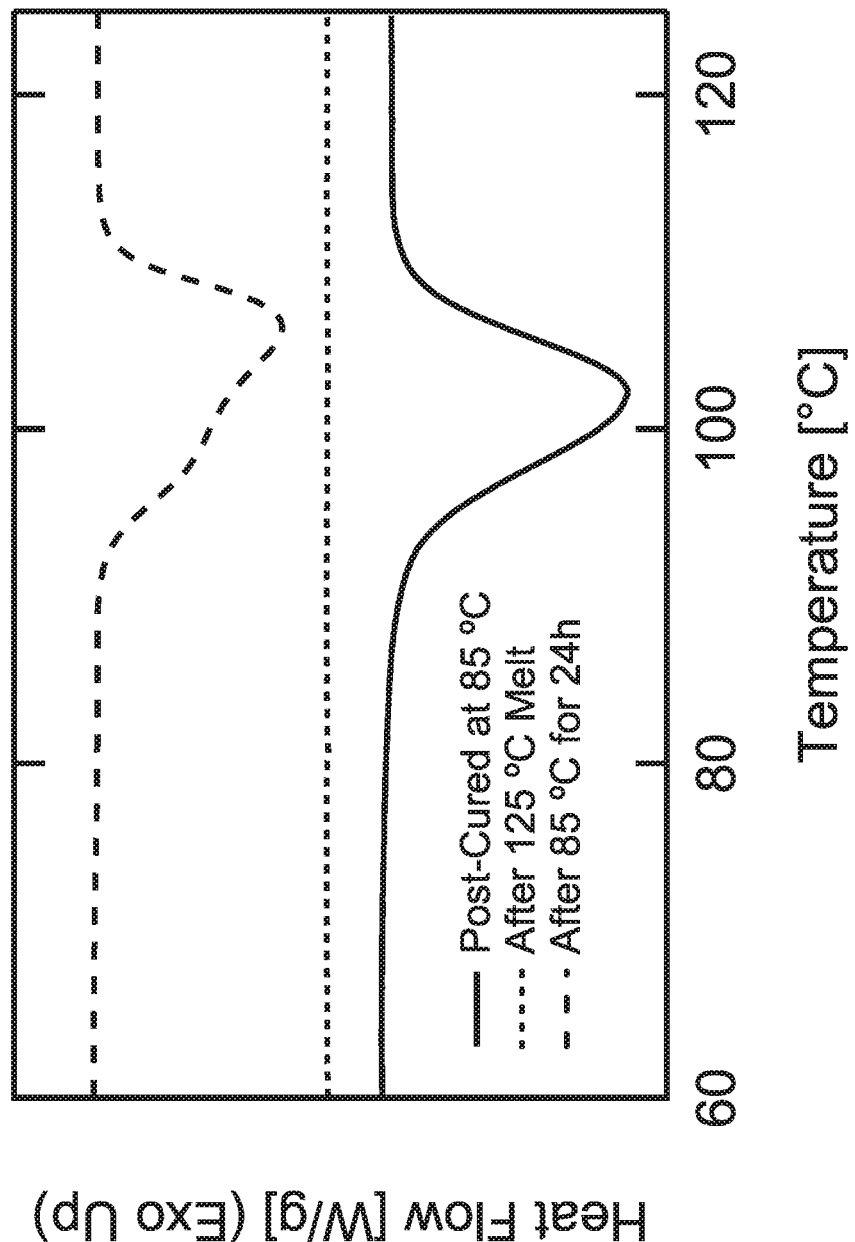
FIG. 8 compares the differential scanning calorimetry heating ramps (arbitrary vertical scale) of the example thiourethane polymer PEH-1 showing the first heating ramp after synthesis, a heating ramp after heating to 125° C. to melt the polymer crystallites and a heating ramp after holding the amorphous polymer at 85° C. for 24 hours to re-crystallize the polymer.
Figure 9:
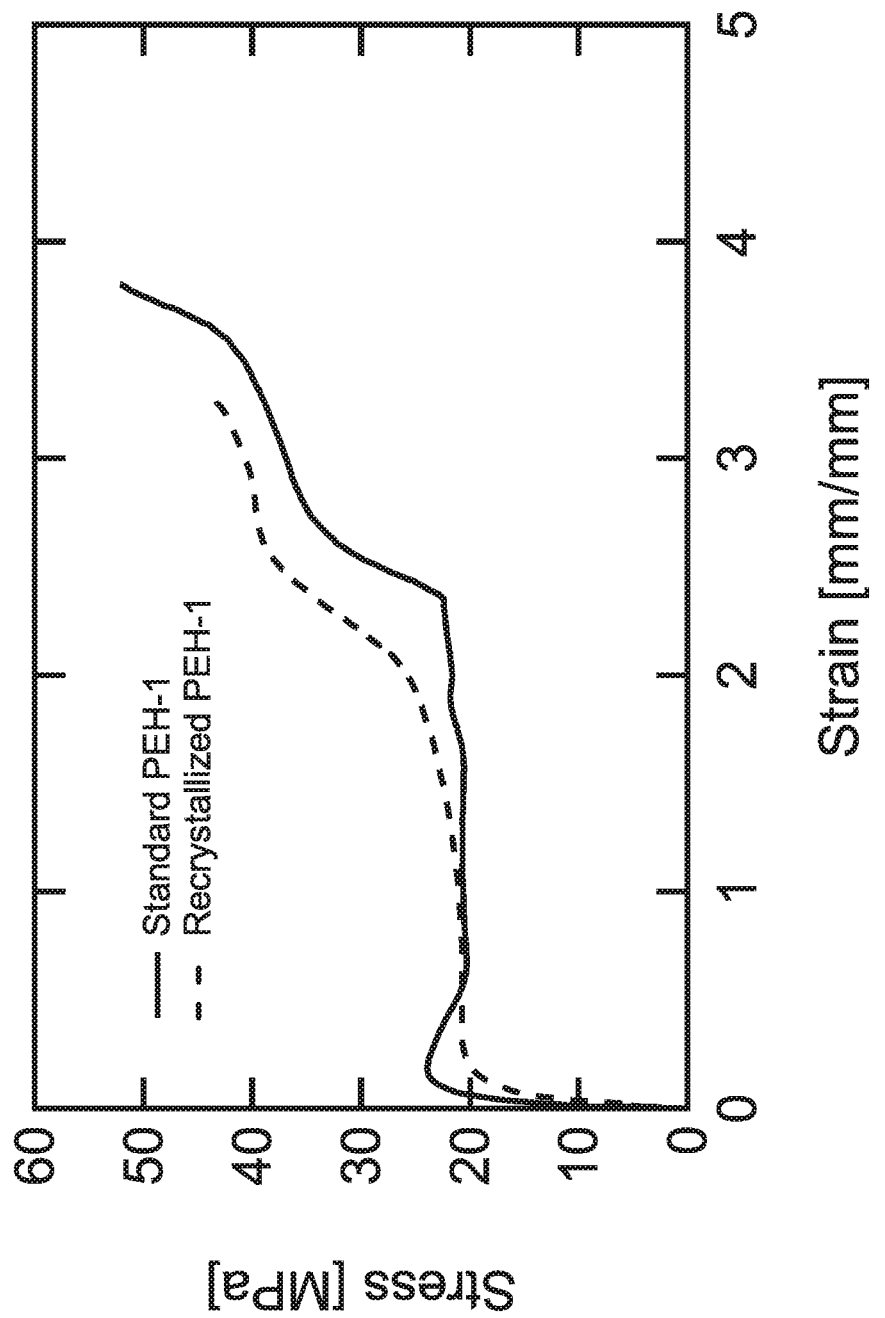
FIG. 9 presents example tensile stress versus strain behavior at 20° C. of the example thiourethane polymer PEH-1 samples after synthesis and after recrystallization such as described in the context of FIG. 8.

The recrystallization characteristics of sample PEH-1 were investigated by DSC and uniaxial tensile testing. Samples of PEH-1 were heated to 125° C. to eliminate the crystalline fraction from the sample. The amorphous polymer was then annealed at 85° C. for 24 hours to induce recrystallization. FIG. 8 compares the differential scanning calorimetry heating ramps (arbitrary vertical scale) of the example thiourethane polymer PEH-1 showing the first heating ramp after synthesis, a heating ramp after heating to 125° C. to melt the polymer crystallites and a heating ramp after holding the amorphous polymer at 85° C. for 24 hours to recrystallize the polymer. FIG. 9 presents example Tensile stress versus strain behavior at 20° C. of the example thiourethane polymer PEH-1 samples after synthesis and after recrystallization such as described in the context of FIG. 8;

Based upon the DSC measurements, the recrystallized PEH-1 recovers 84% of the original crystallinity, or a 16% reduction. Based on the uniaxial tensile measurements, the tensile strength of recrystallized samples of PEH-1 equaled 42.81±1.35 MPa, with a failure strain of 319.28±11.32% and toughness of 87.27±4.54 MJ m$^{-1}$. This represents an approximately 12% reduction in tensile strength, 15% reduction in failure strain, and 12% reduction in toughness.

These results suggest that PEH-1 can undergo processing at temperatures above the crystalline melt temperature and upon recrystallization can still be thermally treated to regain most of its mechanical properties. This suggests that a 3D printed or UV cured polymer part could undergo further processing well above its crystalline melt temperature and then be recrystallized to produce a final, tough part with mechanical properties similar to the originally synthesized polymer. This also suggests that a part with greater elasticity is desired, one could perform an annealing cycle for shorter amounts of time to fine tune the elasticity. Moreover, by adding small amounts of chain-extending monomers that do not participate in the crystallization it may be possible to produce variations on polymer part have a different maximum crystallinity after annealing. It is believed that similar recrystallization characteristics also apply to sample EH or to samples PEH-2 or PEH-3 or variants thereof.

Experiment 2

Additional polythiourthane polymer samples were synthesized by combining a first type of monomer having two or more thiol functional groups and a second type of monomer have two or more isocyanate functional groups procedure similar to that described in Experiment 1 and then tested using procedure similar to that described in Experiment 1.

Additionally, the crystallinity of selected samples was measured using x-ray diffraction analysis (XRD) or DSC. One skilled in the pertinent arts would understand how to collect a suitable x-ray scattering data from a polymer sample, generate a one-dimensional total scattering spectrum from such data and measure the areas of peaks in the spectrum corresponding to crystalline portions and amorphous portions of polymer sample as part of determine a percentage of crystallinity present in the sample.

One skilled in the pertinent arts would understand how to use DSC to gain estimates of percentage of crystallinity of a polymer sample. For instance XRD can be used obtain a percent crystallinity for a particular sample and then that exact same sample can be used to obtain DSC data similar to that depicted in FIG. 3. By integrating the area of the melt endotherm in the DSC profile, one can determine how much heat was needed to melt that particular sample. Since the percent crystallinity of that sample was just determined via XRD, the heat of fusion for that material can be calculated. Any subsequent samples of that same polymer can be tested for percent crystallinity simply by running a DSC heating ramp under the same conditions then using the magnitude of the melt endotherm in conjunction with the calculated heat of fusion. This may be preferable to performing XRD measurement on every sample since XRD is more difficult, time consuming and costly as compared to DSC. This method valid if the crystal structure is not changing. Since each crystalline structure will have a slightly different heat of fusion new XRD data must be collected each new combination monomers and/or different synthesis process.

Table 4 present the different target mole percentages of thiol and isocyanate functional group loading fractions contributed from each of the first types and second type monomers for the different types example polythiourethane polymer samples synthesized.

TABLE 4

Monomer functional group mol percentages for example polythiourethane polymers

| SAMPLE | Thiol Monomers | | | | | | | | | | Isocyanate Monomers | | | | |
| --- | --- | --- | --- | --- | --- | --- | --- | --- | --- | --- | --- | --- | --- | --- | --- |
| | EDT | PDT | HDT | DDT | TCDDT | TDET | EDDT | BD1 | TMTMP | PETMP | IDI | HDI | HDI-Trimer | XDI | TDI |
| 1 | | | | | | | | | | 100 | 100 | | | | |
| 2 | | | | | | | | | | 100 | | 100 | | | |
| 3 | | | | | | | | | | 100 | | | | | 100 |
| 4 | | | | | | | | | | 100 | | | | 100 | |
| 5 | | | | | | | | | | 100 | 100 | | | | |
| 6 | | | | 20 | | | | | | 80 | | 100 | | | |
| 7 | | 20 | | | | | | | | 80 | | 100 | | | |
| 8 | | | | | | | 20 | | | 80 | | 100 | | | |
| 9 | | | 20 | | | | | | | 80 | | 100 | | | |
| 10 | 20 | | | | | | | | | 80 | | 100 | | | |
| 11 | | | | 50 | | | | | | 50 | | 100 | | | |
| 12 | | 50 | | | | | | | | 50 | | 100 | | | |
| 13 | | | | | | | 50 | | | 50 | | 100 | | | |
| 14 | | | 50 | | | | | | | 50 | | 100 | | | |
| 15 | 50 | | | | | | | | | 50 | | 100 | | | |
| 16 | | | | | | | 70 | | | 30 | | 100 | | | |
| 17 | | | | 80 | | | | | | 20 | | 100 | | | |
| 18 | | 80 | | | | | | | | 20 | | 100 | | | |
| 19 | | | | | | | 80 | | | 20 | | 100 | | | |
| 20 | | | 80 | | | | | | | 20 | | 100 | | | |
| 21 | | | | | | | 85 | | | 15 | | 100 | | | |
| 22 | 90 | | | | | | | | | 10 | 50 | 50 | | | |
| 23 | | | | | | | 90 | | | 10 | | 100 | | | |
| 24 | 80 | | | | | | | | | 10 | | 100 | | | |
| 25 | | | | | | | 90 | | | 10 | | | | 100 | |
| 26 | | | | 5 | | | 90 | | | 5 | | 100 | | | |
| 27 | | | | 10 | | | 85 | | | 5 | | 100 | | | |
| 28 | | | | 20 | | | | 75 | | 5 | | 100 | | | |
| 29 | | | | 25 | | | 70 | | | 5 | | 100 | | | |
| 30 | | | | 35 | | | 60 | | | 5 | | 100 | | | |
| 31 | | | | 45 | | | 50 | | | 5 | | 100 | | | |
| 32 | | | | 55 | | | 40 | | | 5 | | 100 | | | |
| 33 | | | | 65 | | | 30 | | | 5 | | 100 | | | |
| 34 | | 95 | | | | | | | | 5 | | | | 100 | |
| 35 | | | 95 | | | | | | | 5 | 100 | | | | |
| 36 | | | 95 | | | | | | | 5 | 85 | 15 | | | |
| 37 | | | 95 | | | | | | | 5 | 70 | 30 | | | |
| 38 | | | 95 | | | | | | | 5 | 55 | 45 | | | |
| 39 | | | 95 | | | | | | | 5 | 50 | 50 | | | |
| 40 | | | | | | | | | 95 | 5 | | 100 | | | |
| 41 | | | | | | | | 95 | | 5 | | 100 | | | |
| 42 | | | | | | 95 | | | | 5 | | 100 | | | |
| 43 | | | | | | | 95 | | | 5 | | | | 100 | |
| 44 | | | 95 | | | | | | | 5 | | | | 100 | |
| 45 | | | | | | | 95 | | | 5 | | | | | 100 |
| 46 | | | | | 95 | | | | | 5 | | | | 100 | |
| 47 | | | | | | | 97 | | | 3 | | 100 | | | |
| 48 | | | | 100 | | | | | | | | | 100 | | |
| 49 | | 100 | | | | | | | | | | | 100 | | |
| 50 | | | | | | | 100 | | | | | | 100 | | |
| 51 | | | 100 | | | | | | | | | | 100 | | |
| 52 | 100 | | | | | | | | | | | | 100 | | |
| 53 | | | | | | | 100 | | | | 50 | 10 | 40 | | |
| 54 | | | | | | | 100 | | | | 40 | 20 | 40 | | |
| 55 | | | | | 100 | | | | | | | 100 | | | |
| 56 | | 100 | | | | | | | | | | 100 | | | |
| 57 | 100 | | | | | | | | | | 100 | | | | |
| 58 | | | | | | | 100 | | | | | 100 | | | |
| 59 | | | 100 | | | | | | | | | 100 | | | |

Table 5 presents selected properties for selected ones of the example polythiourethane polymer samples described in Table 4.

TABLE 5

Properties of example polythiourethane polymers

| Sample | Tg (DSC) (° C.) | Tg (DMA) (° C.) | E¹g (MPa) | E¹c (MPa) | E¹r (MPa) | Tdeg (° C.) | Tmel (° C.) | Crystallinity (%) | Toughness (MJ/m) | Yield Stress (MPa) | Tensile Strength | Strain (%) |
|---|---|---|---|---|---|---|---|---|---|---|---|---|
| 1 | 42.9 | 43.8 | 2200 | | 11.3 | | | | | | | |
| 2 | 60.8 | | | | | 284.5 | | 0.0 | | | | |
| 3 | 120.1 | | | | | | | | | | | |
| 4 | 81.4 | 81 | 2687 | | 18 | | | 0.0 | | | | |
| 5 | 137.7 | 143 | 1900 | | 23 | | | 0.0 | | | | |
| 6 | 48.5 | | | | | 272.3 | | 0.0 | | | | |
| 7 | 58.7 | | | | | | | 0.0 | | | | |
| 8 | 49.4 | | | | | 258.9 | | 0.0 | | | | |
| 9 | 52.4 | | | | | 275.7 | | 0.0 | | | | |
| 10 | 59.4 | 53.0 | 2300.0 | 36.0 | 20.0 | 287.5 | | 0.0 | | | | |
| 11 | 37.8 | | | | | 274.5 | 143.6 | | | | | |
| 12 | 51.7 | 58 | 2000 | | 15 | | | 0.0 | | | | |
| 13 | 33.0 | | | | | 260.0 | | 0.0 | | | | |
| 14 | 39.9 | 50.0 | 2100.0 | 90.0 | 13.0 | 274.4 | 148.2 | | | | | |
| 15 | 57.3 | 55.0 | 2400.0 | 230.0 | 14.0 | 278.1 | 165.0 | | | | | |
| 16 | 20.8 | 19.5 | 2400.0 | | 6.0 | 282.0 | | 0.0 | 3.1 | | 4.8 | 110.8 |
| 17 | 20.5 | | | | | | 145.0 | | | | | |
| 18 | 45.0 | 50 | 2100 | 2000 | 3 | | 164 | | | | | |
| 19 | 15.3 | 14.6 | 2400.0 | | 5.5 | 274.0 | | 0.0 | 3.4 | | 4.5 | 140.5 |
| 20 | 30.5 | | | | | 265.0 | 151.2 | | | | | |
| 21 | 13.2 | 11.3 | 2400.0 | | 4.0 | 275.0 | | 0.0 | 11.3 | | 23.0 | 261.4 |
| 22 | 90.0 | | | | | | 160.0 | | | | | |
| 23 | 10.9 | 13.8 | 3000.0 | 200.0 | 3.0 | 271.0 | 105.0 | 24.1 | 67.6 | 14.0 | 45.0 | 293.1 |
| 24 | 54.7 | | | | | 275.2 | 170.7 | | | | | |
| 25 | 89.0 | | | | | | | | | | | |
| 26 | 10.3 | | | | | | | | 111 | 26 | 62 | 348 |
| 27 | 9.3 | | | | | | | | | | | |
| 28 | 8 | | | | | | | | | | | |
| 29 | 8 | | | | | | 124 | | | | | |
| 30 | 10.4 | | | | | | 131 | | | | | |
| 31 | 11 | | | | | | 138 | | | | | |
| 32 | 15 | | | | | | 143 | | | | | |
| 33 | 20 | | | | | | 149 | | | | | |
| 34 | | | | | | | | | | | | |
| 35 | 108.2 | | | | | | | | | | | |
| 36 | 101.2 | | | | | | | | | | | |
| 37 | 86.1 | | | | | | | | | | | |
| 38 | 76.2 | | | | | | | | | | | |
| 39 | 65.5 | | | | | | | | | | | |
| 40 | 6.8 | | | | | | | | | | | |
| 41 | 9.2 | 8.5 | 3000.0 | 100.0 | 3.3 | 277.0 | 105.0 | 33.4 | 76.4 | 20.0 | 42.0 | 323.9 |
| 42 | 27.9 | | | | | | 174 | | | | | |
| 43 | 37.9 | | | | | | | | 15 | | | |
| 44 | 53 | | | | | | | | | | | |
| 45 | 77.0 | | | | | | | | | | | |
| 46 | 101 | | | | | | | | | | | |
| 47 | 7.6 | 8.8 | 3000.0 | 200.0 | 3.0 | 282.0 | 105.0 | 36.5 | 99.3 | 23.0 | 49.0 | 376.1 |
| 48 | 27.8 | | | | | | | 0 | | | | |
| 49 | 55 | | | | | | | 0 | | | | |
| 50 | 30.5 | 31 | 1900 | | 8 | | | 0 | | | | |
| 51 | 41.4 | | | | | | | 0 | | | | |
| 52 | 62 | 71 | 1400 | | 13 | | | 0 | | | | |
| 53 | 66 | | | | | | | | | | | |
| 54 | 45.0 | | | | | | | | | | | |
| 55 | 24.2 | | | | | | 180 | | | | | |
| 56 | 36.8 | | | | | | 160 | | | | | |
| 57 | 120.0 | | | | | | | | | | | |
| 58 | 7.4 | 7.2 | 3000.0 | 250.0 | | 278.0 | 105.0 | 30 to 50 | 99.3 | 25.0 | 40.1 | 385.7 |
| 59 | 25.2 | | | | | 275 | 200 | | | | | |

Figure 10:
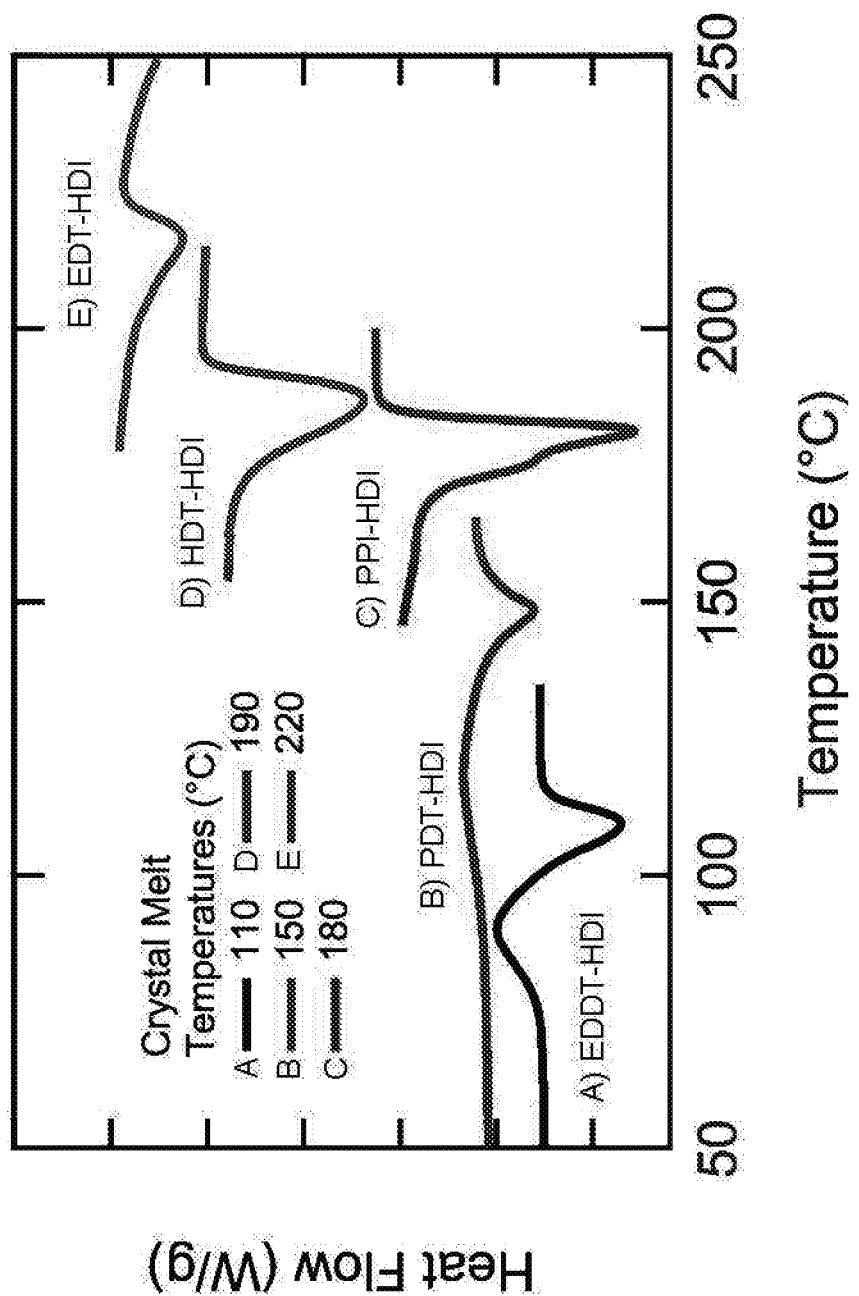
FIG. 10 presents example crystal melt temperature profiles obtained from DSC analysis of different example thiourethane polymers synthesized using different combinations of the first and second types of monomers, such a described in the context of TABLE 4.

FIG. 10 presents example crystal melt temperature profiles obtained from DSC analysis of different example thiourethane polymers synthesized using different combinations of the first and second monomers types, e.g., such a described in the context of TABLE 4.

Figure 11:
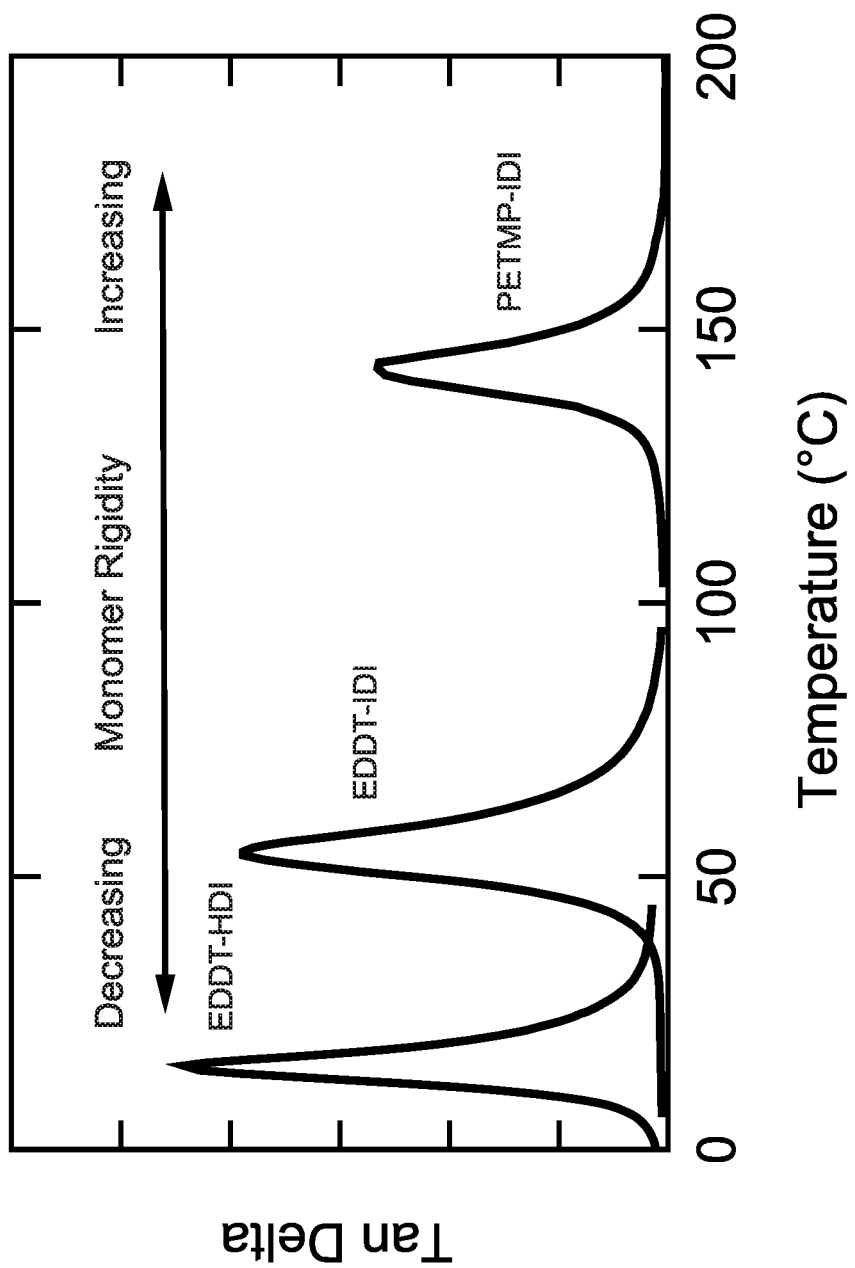
FIG. 11 presents example tan delta versus temperature profiles obtained from dynamic mechanical analysis of different example thiourethane polymers synthesized using different combinations of the first and second types of monomers, such as described in the context of TABLE 4.

FIG. 11 presents example tan delta versus temperature profiles obtained from DMA analysis of different example thiourethane polymers synthesized using different combinations of the first and second monomers types, e.g., such a described in the context of TABLE 4.

Figure 12:
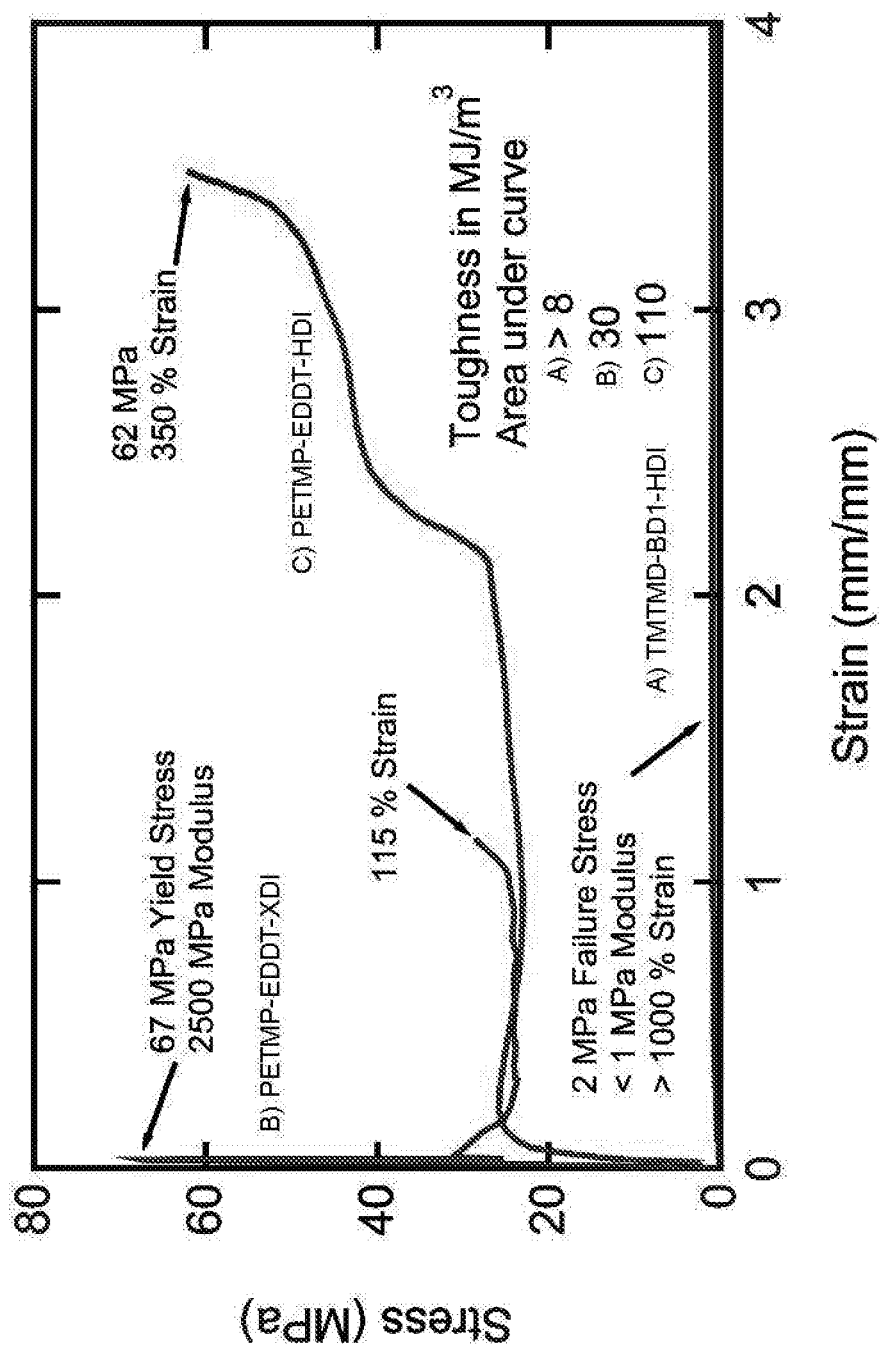
FIG. 12 presents example stress-strain behaviors obtained from uniaxial tensile testing of different example thiourethane polymers synthesized using different combinations of the first and second types of monomers, such a described in the context of TABLE 4.

FIG. 12 presents example stress-strain behaviors obtained from uniaxial tensile testing analysis of different example thiourethane polymers synthesized using different combinations of the first and second monomers types, e.g., such a described in the context of TABLE 4.

FIGS. 10-12 illustrate that thiourethane polymers synthesized according to principles presented in this disclosure can be engineered to have a wide range crystal melt temperatures (e.g., from 110 to 220° C.), glass transition temperatures (e.g., from 10° C. to 140° C.) and stress-strain properties (e.g., highly rigid for a polymer synthesized using PETMP, EDDT and XDI monomers polymers, ultra tough for a polymer synthesized using PETMP, EDDT and HDI monomers or highly rubbery for a polymer synthesized using TMTMD, BD1 and HDI polymers) to meet a broad range of application specific requirements.

Those skilled in the pertinent arts to which this application relates will appreciate that other and further additions, deletions, substitutions and modifications may be made to the described embodiments.

What is claimed is:

1. A polymer jetting method of manufacturing a polymer part, comprising:
   exposing a deposited mixture to light to photo-initiate decomposition of a photolatent base in the mixture to form a non-nucleophillic base catalyst having a pKa greater than 7 to thereby initiate step-growth polymerization of a first type of monomer with a second type of monomer in the mixture to thereby form a semi-crystalline thiourethane polymer part, wherein the first type of monomer includes two or more thiol functional groups and the second type of monomer includes two or more isocyanate functional groups.

2. The method of claim 1, further including:
   adding the first type of monomer to a first container and adding the second type of monomer to a second container; and
   depositing the first type of monomer from the first container on a substrate surface, and depositing the second type of monomer from the second container on the substrate surface to thereby form the deposited mixture.

3. The method of claim 1, further including:
   forming a mixture of a first type of monomer, a second type of monomer and a photolatent base in a container; and
   depositing the mixture on a surface of the substrate to thereby form the deposited mixture.

4. The method of claim 1, wherein the first type of monomer is free of -ene or isocyanate functional groups and the second type of monomer is free of -ene or thiol functional groups.

5. The method of claim 1, wherein the semi-crystalline thiourethane polymer part is a thermoset semi-crystalline thiourethane polymer part, or, the semicrystalline thiourethane polymer part is a thermoplastic semi-crystalline thiourethane polymer part.

6. The method of claim 1, wherein:
   the first type of monomer includes di-thiol functionalized monomers and tri-thiol or higher functionalized monomers, wherein the di-thiol functionalized monomers equals from 25 to 90 mole percent, and the tri-thiol or higher functionalized monomers equals from 75 to 10 mole percent of thiols, of the first type of monomer, or,
   the second type of monomer includes di-isocyanate functionalized monomers and tri-isocyanate or higher functionalized monomers, wherein the di-isocyanate functionalized monomers equals from 25 to 90 mole percent, and the tri-isocyanate or higher functionalized monomers equals from 75 to 10 mole percent, of isocyanates of the second type of monomer.

7. The method of claim 1, wherein the first type of monomer is one or more of 2,2'-(ethylenedioxy)diethanethiol or pentaerythritol tetrakis(3-mercaptopropionate).

8. The method of claim 1, wherein:
   the first type of monomer includes di-thiol functionalized monomers and tri-thiol or higher functionalized monomers, wherein the di-thiol functionalized monomers equals from about 90 to 97 mole percent, and the tri-thiol or higher functionalized monomers equals from about 10 to 3 mole percent of thiols, of the first type of monomer, and,
   the second type of monomer including di-isocyanate functionalized monomers equals about 100 mole percent, of isocyanates of the second type of monomer.

9. The method of claim 1, wherein the polymer part has a toughness greater than or equal to about 10 MJ/m$^3$.

10. The method of claim 1, wherein the mixture has a viscosity similar to water in the range of about 0.3 to about 10 mPa·s.

11. The method of claim 1, wherein the polymer part has a degree of crystallinity between 20% and 60%.

12. A stereolithography method of manufacturing a polymer part, comprising:
    forming a mixture of a first type of monomer, a second type of monomer, and a photolatent base, wherein the first type of monomer include two or more thiol functional groups and the second type of monomer include two or more isocyanate functional groups; and
    exposing portions of the mixture to light to photo-initiate decomposition of the photolatent base to form a non-nucleophillic base catalyst having a pKa greater than 7 to thereby initiate step-growth polymerization of the first type of monomer with the second type of monomers to thereby form a semi-crystalline thiourethane polymer part.

13. The method of claim 12, wherein the first type of monomer is free of -ene or isocyanate functional groups and the second type of monomer is free of -ene or thiol functional groups.

14. The method of claim 12, wherein the semi-crystalline thiourethane polymer part is a thermoset semi-crystalline thiourethane polymer part, or, the semicrystalline thiourethane polymer part is a thermoplastic semi-crystalline thiourethane polymer part.

15. The method of claim 12, wherein:
    the first type of monomer includes di-thiol functionalized monomers and tri-thiol or higher functionalized monomers, wherein the di-thiol functionalized monomers equals from 25 to 90 mole percent, and the tri-thiol or higher functionalized monomers equals from 75 to 10 mole percent of thiols, of the first type of monomer, or,
    the second type of monomer includes di-isocyanate functionalized monomers and tri-isocyanate or higher functionalized monomers, wherein the di-isocyanate functionalized monomers equals from 25 to 90 mole percent, and the tri-isocyanate or higher functionalized monomers equals from 75 to 10 mole percent, of isocyanates of the second type of monomer.

16. The method of claim 12, wherein the first type of monomer is one or more of 2,2'-(ethylenedioxy)diethanethiol or pentaerythritol tetrakis(3-mercaptopropionate).

17. The method of claim 12, wherein:
    the first type of monomer includes di-thiol functionalized monomers and tri-thiol or higher functionalized monomers, wherein the di-thiol functionalized monomers equals from about 90 to 97 mole percent, and the tri-thiol or higher functionalized monomers equals from about 10 to 3 mole percent of thiols, of the first type of monomer, and,
    the second type of monomer including di-isocyanate functionalized monomers equals about 100 mole percent, of isocyanates of the second type of monomer.

18. The method of claim 12, wherein the polymer part has a toughness greater than or equal to about 10 MJ/m$^3$.

19. The method of claim 12, wherein the mixture has a viscosity similar to water in the range of about 0.3 to about 10 mPa·s.

20. The method of claim 12, wherein the polymer part has a degree of crystallinity between 20% and 60%.

\* \* \* \* \*